US012633333B2

(12) United States Patent
Lee

(10) Patent No.: US 12,633,333 B2
(45) Date of Patent: May 19, 2026

(54) OPERATION METHOD OF SENSE AMPLIFIER WITH PRECHARGE, OFFSET CANCELLATION, CHARGE SHARING, PRE-SENSING, AND RESTORE OPERATION STEPS

(71) Applicant: Samsung Electronics Co., Ltd., Suwon-si (KR)

(72) Inventor: Dongil Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 130 days.

(21) Appl. No.: 18/506,552

(22) Filed: Nov. 10, 2023

(65) Prior Publication Data

US 2024/0339151 A1    Oct. 10, 2024

(30) Foreign Application Priority Data

Apr. 5, 2023    (KR) ........................ 10-2023-0044865

(51) Int. Cl.
G11C 7/06        (2006.01)
G11C 11/4091     (2006.01)
G11C 11/4094     (2006.01)

(52) U.S. Cl.
CPC ...... G11C 11/4091 (2013.01); G11C 11/4094 (2013.01)

(58) Field of Classification Search
CPC ........................ G11C 11/4091; G11C 11/4092
See application file for complete search history.

(56) References Cited

U.S. PATENT DOCUMENTS

| | | | |
|---|---|---|---|
| 9,431,071 B2 | 8/2016 | Moon et al. | |
| 10,706,911 B1 | 7/2020 | Seo et al. | |
| 10,854,277 B2 | 12/2020 | Seo et al. | |
| 10,902,889 B2 | 1/2021 | Oak | |
| 11,043,257 B2 | 6/2021 | Kim et al. | |
| 11,335,385 B2* | 5/2022 | Lam | G11C 11/4091 |
| 11,423,957 B2 | 8/2022 | Peng et al. | |
| 11,594,264 B1* | 2/2023 | Chi | G11C 11/4094 |
| 2015/0036444 A1* | 2/2015 | Seo | G11C 11/4091 |
| | | | 365/210.1 |
| 2018/0061461 A1* | 3/2018 | Seo | G11C 7/18 |
| 2018/0182449 A1* | 6/2018 | Kim | G11C 11/4094 |
| 2020/0082872 A1* | 3/2020 | Seo | G11C 11/4091 |
| 2022/0157369 A1 | 5/2022 | Kim | |
| 2022/0262409 A1 | 8/2022 | Lin et al. | |

(Continued)

*Primary Examiner* — Mushfique Siddique
(74) *Attorney, Agent, or Firm* — Wolf, Greenfield & Sacks, P.C.

(57) ABSTRACT

A sense amplifier which includes a sense amplifier circuit that includes a first NMOS transistor and a second NMOS transistor, the first NMOS transistor being connected to a first bit line and the second NMOS transistor being connected to a second bit line complementary to the first bit line, a first isolation/offset cancellation circuit that includes a first isolation switch connecting the first bit line and a first sensing bit line and a first offset cancellation switch connecting the first bit line and a second sensing bit line complementary to the first sensing bit line, and a second isolation/offset cancellation circuit that includes a second isolation switch connecting the second bit line and the second sensing bit line and a second offset cancellation switch connecting the second bit line and the first sensing bit line.

20 Claims, 20 Drawing Sheets

(56) References Cited

U.S. PATENT DOCUMENTS

| | | | |
|---|---|---|---|
| 2022/0328093 A1 | 10/2022 | Chang et al. | |
| 2023/0121199 A1* | 4/2023 | Cho | G11C 7/065 |
| | | | 365/185.21 |
| 2023/0238052 A1* | 7/2023 | Shang | G11C 7/12 |
| | | | 365/149 |
| 2023/0238054 A1* | 7/2023 | Shang | G11C 11/4091 |
| | | | 365/185.21 |
| 2023/0377630 A1* | 11/2023 | Cheng | G11C 7/065 |
| 2024/0170030 A1* | 5/2024 | Xie | G11C 7/08 |

* cited by examiner

OPERATION METHOD OF SENSE AMPLIFIER WITH PRECHARGE, OFFSET CANCELLATION, CHARGE SHARING, PRE-SENSING, AND RESTORE OPERATION STEPS

CROSS-REFERENCE TO RELATED APPLICATIONS

This application claims priority under 35 U.S.C. § 119 to Korean Patent Application No. 10-2023-0044865, filed on Apr. 5, 2023, in the Korean Intellectual Property Office, the disclosure of which is incorporated by reference herein in its entirety.

BACKGROUND

Embodiments of the present disclosure described herein relate to a semiconductor device, and more particularly, relate to a sense amplifier, a method of operating a sense amplifier, and a volatile memory device including the sense amplifier.

A volatile memory device refers to a memory device that loses data stored therein when power is turned off. The volatile memory device includes a static random access memory (SRAM), a dynamic RAM (DRAM), a synchronous DRAM, etc.

In the DRAM, a memory cell array is connected to a bit line BL and a complementary bit line BLB. When the read operation for data stored in the memory cell array is performed, a sense amplifier senses and amplifies a voltage difference of the bit line BL and the complementary bit line BLB. In this case, the sense amplifier increases a voltage level difference of a sensing bit line SBL and a complementary sensing bit line SBLB.

However, when the sense amplifier senses a voltage difference of the bit line BL and the complementary bit line BLB, there may be a significant difference between the amount of charges stored in the sensing bit line SBL and the amount of charges stored in the complementary sensing bit line SBLB. The charge amount difference may cause a decrease in sensing sensitivity of the sense amplifier. Accordingly, a method capable of decreasing a charge amount difference of the sensing bit line SBL and the complementary sensing bit line SBLB may be desirable to improve the sensing sensitivity of the sense amplifier.

SUMMARY

Embodiments of the present disclosure provide a sense amplifier with a shape-symmetric structure, a method of operating the sense amplifier, and a memory device including the sense amplifier.

According to an embodiment, a sense amplifier includes a sense amplifier circuit that includes a first NMOS transistor and a second NMOS transistor, wherein the first NMOS transistor is connected to a first bit line connected to a first memory cell among a plurality of memory cells included in a volatile memory device and the second NMOS transistor is connected to a second bit line complementary to the first bit line, a first isolation/offset cancellation circuit that includes a first isolation switch connecting the first bit line and a first sensing bit line in response to an isolation signal and a first offset cancellation switch connecting the first bit line and a second sensing bit line complementary to the first sensing bit line in response to an offset cancellation signal, and a second isolation/offset cancellation circuit that includes a second isolation switch connecting the second bit line and the second sensing bit line in response to the isolation signal and a second offset cancellation switch connecting the second bit line and the first sensing bit line in response to the offset cancellation signal. The sense amplifier circuit further includes a first equalization switch that connects the second sensing bit line with a first power node, to which a first driving voltage or a second driving voltage of the memory device is applied, in response to an equalization signal, and a second equalization switch that connects the first sensing bit line with the first power node in response to the equalization signal.

According to an embodiment, a method of operating a sense amplifier includes performing a first precharge operation such that a first bit line and a second bit line are precharged with a first driving voltage of a plurality of driving voltages of a memory device, wherein the first bit line is connected to a first memory cell among a plurality of memory cells included in the memory device and the second bit line is complementary to the first bit line and is connected to a second memory cell among the plurality of memory cells, performing a charge sharing operation such that charges of the first memory cell and charges of the first bit line are shared, after performing the first precharge operation, performing a second precharge operation such that a first sensing bit line and a second sensing bit line complementary to the first sensing bit line are charged with a second driving voltage of the plurality of driving voltages, after performing the charge sharing operation, performing a pre-sensing operation such that the first sensing bit line is charged or discharged based on a voltage change of the first bit line, after performing the second precharge operation, and performing a restore operation such that the first bit line is charged or discharged based on a voltage change of the first sensing bit line, after performing the pre-sensing operation.

According to an embodiment, a memory device includes memory cells that includes a first memory cell and a second memory cell, a first bit line that is connected to the first memory cell, a second bit line that is complementary to the first bit line and is connected to the second memory cell, and a sense amplifier that senses data stored in the first memory cell based on a voltage change of the first bit line. The sense amplifier includes a sense amplifier circuit that includes a first NMOS transistor connected to the first bit line, a second NMOS transistor connected to the second bit line, a first equalization switch connecting a second sensing bit line with a first power node, to which a first driving voltage or a second driving voltage of the memory device is applied, in response to an equalization signal, and a second equalization switch connecting a first sensing bit line with the first power node in response to the equalization signal, a first isolation/offset cancellation circuit that includes a first isolation switch connecting the first bit line and the first sensing bit line in response to an isolation signal and a first offset cancellation switch connecting the first bit line and the second sensing bit line complementary to the first sensing bit line in response to an offset cancellation signal, a second isolation/offset cancellation circuit that includes a second isolation switch connecting the second bit line and the second sensing bit line in response to the isolation signal and a second offset cancellation switch connecting the second bit line and the first sensing bit line in response to the offset cancellation signal, and a conjunction circuit that includes a precharge switch connecting the first power node with a second power node, to which the first driving voltage is applied, in response to a precharge signal and an activation switch connecting the first power node with a third power node, to which the second driving voltage is applied, in response to an activation signal.

BRIEF DESCRIPTION OF THE FIGURES

The above and other objects and features of the present disclosure will become apparent by describing in detail embodiments thereof with reference to the accompanying drawings.

FIG. 1 is a block diagram illustrating an electronic device according to embodiments of the present disclosure.

DETAILED DESCRIPTION

Figure 2:
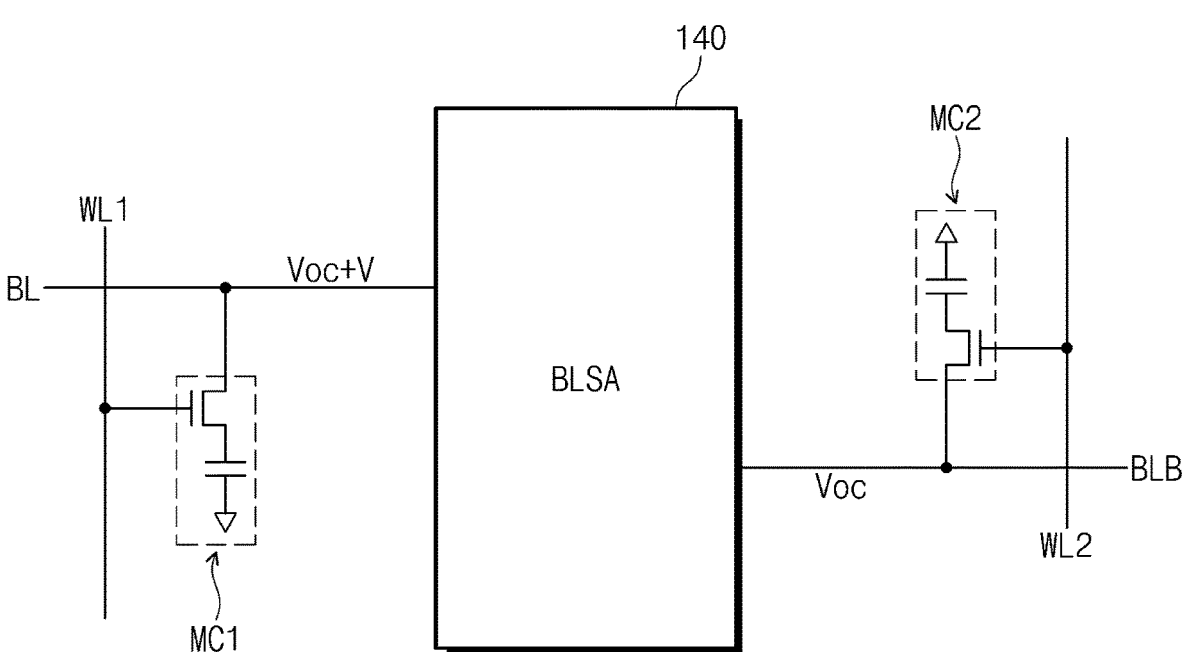
FIG. 2 is a diagram that illustrates a sensing operation of a sense amplifier according to embodiments of the present disclosure.

Hereinafter, embodiments are described in detail with reference to the accompanying drawings. The same reference numerals are used for the same components in the drawings, and redundant descriptions thereof are omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

A sense amplifier operates based on a precharge operation, an offset cancellation operation, a charge sharing operation, a pre-sensing operation, and a restore operation.

The sense amplifier includes various semiconductor elements. The semiconductor elements included in the sense amplifier are different in characteristic (e.g., threshold voltage) due to process, voltage and temperature (PVT) variations. The characteristic difference may cause offset noise of the sense amplifier. Accordingly, the sense amplifier may perform the offset cancellation operation between the precharge operation and the charge sharing operation.

However, in the specification, below, the description will be given under the assumption that the offset noise does not occur in the sense amplifier. In this idealized case, the offset cancellation operation may mean that voltage levels of the bit line BL and the complementary bit line BLB are decreased, for example, as much as threshold voltages of each of the semiconductor elements included in the sense amplifier. This will be described in detail below.

Figure 1:
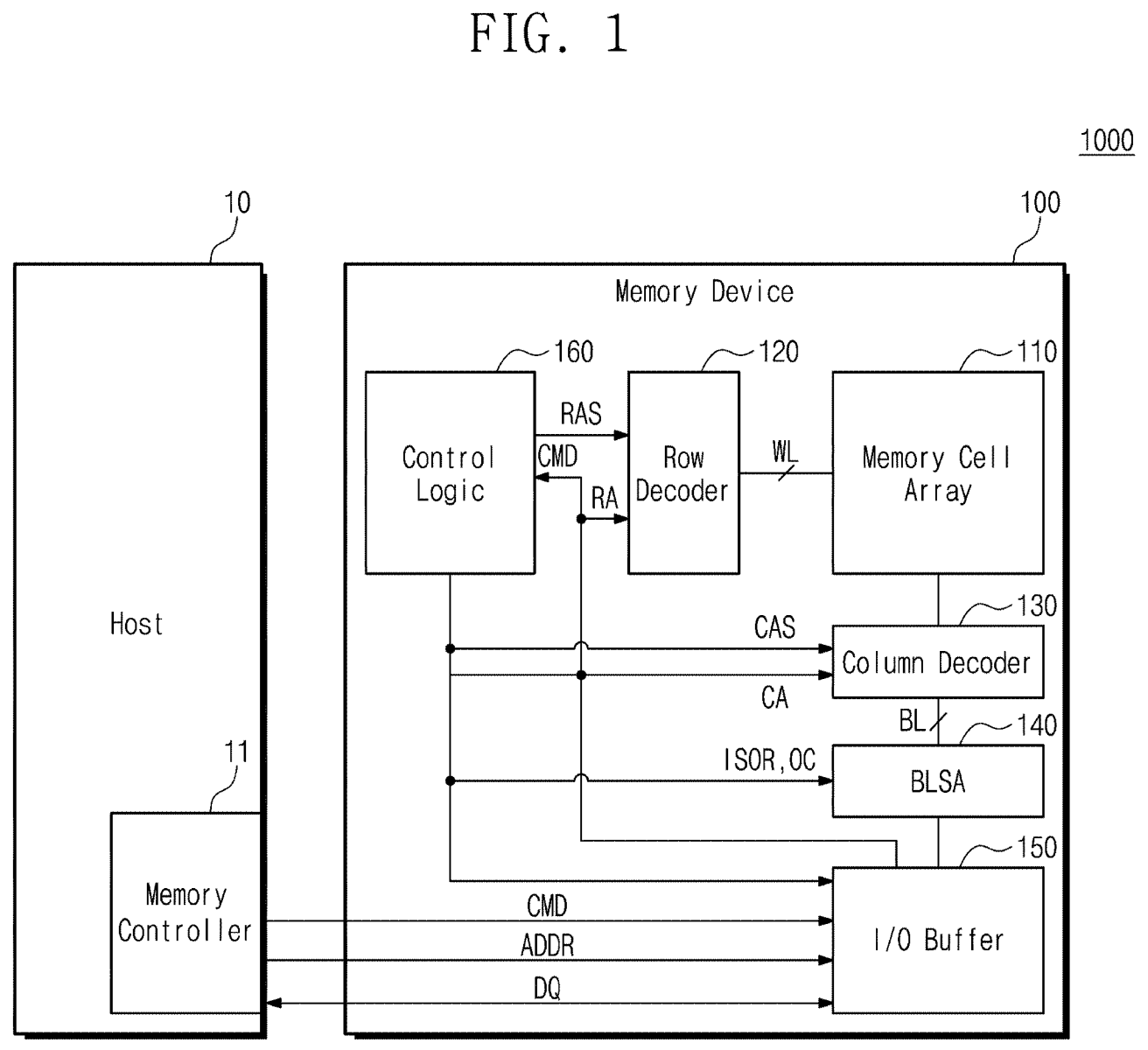

FIG. 1 is a block diagram illustrating an electronic device 1000 according to embodiments of the present disclosure. Referring to FIG. 1, the electronic device 1000 may include a host 10, a memory controller 11, and a memory device 100.

The host 10 including the memory controller 11 may transmit a command CMD and an address ADDR to the memory device 100. Alternatively, the host 10 may transmit the command CMD and the address ADDR to the memory device 100 through the memory controller 11. The host 10 including the memory controller 11 may exchange a data signal DQ with the memory device 100.

In the specification, below, the description will be given as the host 10 including the memory controller 11 transmits the command CMD and the address ADDR to the memory device 100.

For example, the host 10 may be configured to transmit a write command, an address, and the data signal DQ to the memory device 100. The memory device 100 may record data at memory cells corresponding to the write command and address received from the host 10.

For example, the host 10 may be configured to transmit a read command and an address to the memory device 100. The memory device 100 may transmit data, which are read from memory cells corresponding to the read command and the address received from the host 10, to the host 10 as the data signal DQ.

The memory device 100 may be a dynamic random access memory (DRAM), but the present disclosure is not limited thereto. The memory device 100 may be one of various random access memories such as a static random access memory (SRAM), a magnetic random access memory (MRAM), a phase-change random access memory (PRAM), a ferroelectric random access memory (FRAM), and a resistive random access memory (RRAM).

The memory device 100 may include a memory cell array 110, a row decoder 120, a column decoder 130, a bit line sense amplifier (BLSA) (hereinafter referred to as a "sense amplifier") 140, an input/output buffer 150, and control logic 160.

The memory cell array 110 may include a plurality of memory cells (not illustrated) arranged in a row direction and a column direction. Each of the plurality of memory cells may be connected to one of a plurality of word lines WL and one of a plurality of bit lines BL.

The row decoder 120 may be configured to select one of the plurality of word lines WL connected to the memory cell array 110. For example, the row decoder 120 may be configured to receive a row address RA from the input/output buffer 150. The row decoder 120 may be configured to select one word line corresponding to the received row address RA from among the plurality of word lines WL. The row decoder 120 may be configured to activate the selected word line in response to a row address control signal RAS. The row address control signal RAS may be received from the host 10.

The column decoder 130 may be configured to select one of the plurality of bit lines BL connected to the memory cell array 110. For example, the column decoder 130 may be configured to receive a column address CA from the input/output buffer 150. The column decoder 130 may select one bit line corresponding to the column address CA from among the plurality of bit lines BL. The column decoder 130 may be configured to activate the selected bit line in response to a column address control signal CAS. The column address control signal CAS may be received from the host 10.

The sense amplifier 140 may be connected to the plurality of bit lines BL connected to the memory cell array 110. The sense amplifier 140 may be configured to sense a voltage change of the selected (or activated) bit line among the plurality of bit lines BL and may amplify and output the sensed voltage change. A configuration and an operation of the sense amplifier 140 will be described in detail with reference to drawings below.

The input/output buffer 150 may be configured to receive the address ADDR from the host 10. The input/output buffer 150 may be configured to provide the row address RA to the row decoder 120. The input/output buffer 150 may be configured to provide the column address CA to the column decoder 130. The input/output buffer 150 may be configured to receive the command CMD from the host 10 and may provide the command CMD to the control logic 160. The input/output buffer 150 may be configured to output data to the host 10 as the data signal DQ, based on the amplified voltage from the sense amplifier 140.

The control logic 160 may be configured to control all the components of the memory device 100. The control logic 160 may be configured to control the row decoder 120 based on the row address control signal RAS. The control logic 160 may be configured to control the column decoder 130 based on the column address control signal CAS. The control logic 160 may be configured to control the input/output buffer 150 based on a control signal (not illustrated).

The control logic 160 may be configured to control the sense amplifier 140 based on an isolation signal ISOR and an offset cancellation signal OC. The sense amplifier 140 may be configured to perform the offset cancellation operation and the pre-sensing operation based on the isolation signal ISOR and the offset cancellation signal OC. This will be described in detail below.

FIG. 2 is a diagram illustrating a sensing operation of the sense amplifier 140 according to embodiments of the present disclosure. For brevity of description, the remaining components other than the sense amplifier 140, the bit line BL, the complementary bit line BLB, the first and second word lines WL1 and WL2, and the first and second memory cells MC1 and MC2 are omitted.

Referring to FIG. 2, the sense amplifier 140 may be electrically connected to bit lines of the memory device 100; during the read operation or the refresh operation of the memory device 100, the sense amplifier 140 may be configured to sense and amplify data stored in a plurality of memory cells of the memory device 100 based on a voltage difference of two bit lines being complementary from among the bit lines.

The sense amplifier 140 may be connected to a first bit line BL and a second bit line BLB that are complementary. When the first bit line BL is referred to as a "bit line", the second bit line BLB may be referred to as a "complementary bit line".

The first memory cell MC1 may be connected to the first bit line BL, and the second memory cell MC2 may be connected to the second bit line BLB. The first memory cell MC1 may be connected to the first word line WL1, and the second memory cell MC2 may be connected to the second word line WL2. Each of the first and second memory cells MC1 and MC2 may include a cell transistor and a cell capacitor.

In this case, based on voltages applied through the first and second word lines WL1 and WL2, the first memory cell MC1 connected to the first bit line BL may be selected, and the second memory cell MC2 connected to the second bit line BLB may not be selected.

Before the first word line WL1 connected to the first memory cell MC1 is activated, the first bit line BL connected to the first memory cell MC1 may be in a state of being charged or discharged to a voltage level Voc formed after the precharge operation and the offset cancellation operation.

Afterwards, as the first word line WL1 is activated, the charge sharing may be made between the first bit line BL charged to the voltage level Voc and the capacitor of the first memory cell MC1. In an embodiment, in FIG. 2, when a logical value of data stored in the first memory cell MC1 is "1", the voltage level of the first bit line BL may be increased by the charge sharing as much as a voltage variation "V".

Although not illustrated, when a logical value of data stored in the first memory cell MC1 is "0", the voltage level of the first bit line BL may be decreased by the charge sharing as much as the voltage variation "V".

The voltage level of the second word line WL2 connected to the second word line WL2 not activated may maintain the voltage level Voc formed after the precharge operation and the offset cancellation operation.

An example in which one memory cell (e.g., the first memory cell MC1 or the second memory cell MC2) is connected to each of the first bit line BL and the second bit line BLB is illustrated in FIG. 2, but embodiments of the present disclosure are not limited thereto. For example, a plurality of memory cells may be connected to each of the first bit line BL and the second bit line BLB.

Figure 3:
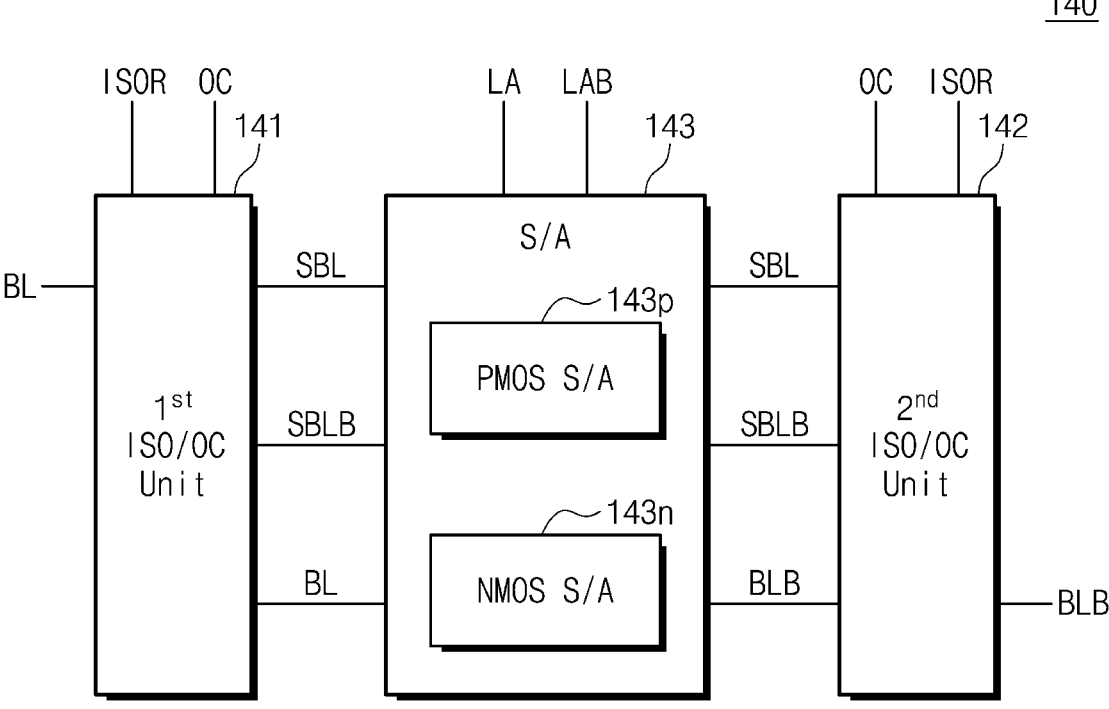
FIG. 3 is a block diagram illustrating a sense amplifier according to embodiments of the present disclosure.

FIG. 3 is a block diagram illustrating the sense amplifier 140 according to embodiments of the present disclosure. For brevity of description, components that are unnecessary to describe a configuration and an operation of the sense amplifier 140 are omitted. However, embodiments of the present disclosure are not limited thereto. For example, a component, such as a conjunction (CJT) circuit according to the present disclosure, may be further included in the sense amplifier 140. This will be described in detail later.

Referring to FIG. 3, the sense amplifier 140 may include a first isolation/offset cancellation unit ($1^{st}$ ISO/OC Unit) 141, a second isolation/offset cancellation unit (($2^{nd}$ ISO/OC Unit) 142, and a sense amplifier unit 143.

The first isolation/offset cancellation unit 141 is connected to the bit line BL, the sensing bit line SBL, and the complementary sensing bit line SBLB. The second isolation/offset cancellation unit 142 is connected to the complementary bit line BLB, the sensing bit line SBL, and the complementary sensing bit line SBLB. The first and second isolation/offset cancellation units 141 and 142 may be configured to receive the isolation signal ISOR and the offset cancellation signal OC and may be configured to operate based on the received isolation signal ISOR and the received offset cancellation signal OC.

For example, the first isolation/offset cancellation unit 141 may be configured to disconnect the bit line BL from the sensing bit line SBL in response to the isolation signal ISOR. The first isolation/offset cancellation unit 141 may be configured to disconnect the bit line BL from the complementary sensing bit line SBLB in response to the offset cancellation signal OC. The second isolation/offset cancellation unit 142 may be configured to disconnect the complementary bit line BLB from the complementary sensing bit line SBLB in response to the isolation signal ISOR. The second isolation/offset cancellation unit 142 may be configured to disconnect the complementary bit line BLB from the sensing bit line SBL in response to the offset cancellation signal OC.

The sense amplifier unit 143 includes a PMOS sense amplifier unit 143*p* and an NMOS sense amplifier unit 143*n*. The sense amplifier unit 143 may be configured to sense and amplify a voltage difference of the bit line BL and the complementary bit line BLB in response to a first power signal LA and a second power signal LAB. In an embodiment, the NMOS sense amplifier unit 143*n* is directly connected to the bit line BL and the complementary bit line BLB. Gates of transistors included in the NMOS sense amplifier unit 143*n* are connected to the bit line BL and the complementary bit line BLB.

Figure 4:
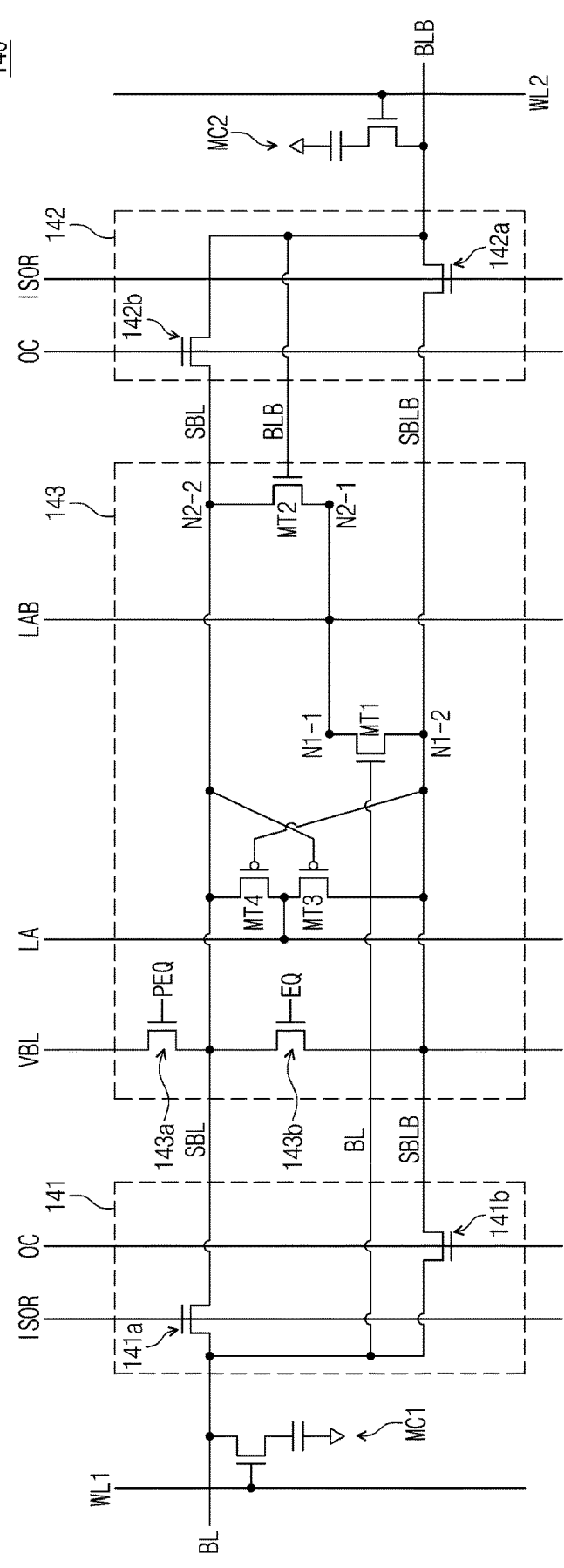
FIG. 4 is a circuit diagram illustrating a sense amplifier in detail according to embodiments of the present disclosure.

FIG. 4 is a circuit diagram illustrating a sense amplifier in detail according to embodiments of the present disclosure. Referring to FIG. 4, the sense amplifier 140 includes the first isolation/offset cancellation unit 141, the second isolation/offset cancellation unit 142, and the sense amplifier unit 143.

The first isolation/offset cancellation unit 141 may include a first isolation switch 141*a* and a first offset cancellation switch 141*b*. A first terminal end of the first isolation switch 141*a* may be connected to the bit line BL, and a second terminal end thereof may be connected to the sensing bit line SBL. The first isolation switch 141*a* operates in response to the isolation signal ISOR applied to a gate terminal thereof.

A first terminal end of the first offset cancellation switch 141*b* may be connected to the bit line BL, and a second terminal end thereof may be connected to the complementary sensing bit line SBLB. The first offset cancellation switch 141*b* may operate in response to the offset cancellation signal OC applied to a gate terminal thereof.

The second isolation/offset cancellation unit 142 may include a second isolation switch 142*a* and a second offset cancellation switch 142*b*. A first terminal end of the second isolation switch 142*a* may be connected to the complementary bit line BLB, and a second terminal end thereof may be connected to the complementary sensing bit line SBLB. The second isolation switch 142*a* may operate in response to the isolation signal ISOR applied to a gate terminal thereof.

A first terminal end of the second offset cancellation switch 142*b* may be connected to the complementary bit line BLB, and a second terminal end thereof may be connected to the sensing bit line SBL. The second offset cancellation switch 142*b* may operate in response to the offset cancellation signal OC applied to a gate terminal thereof.

The sense amplifier unit 143 may include first and second PMOS transistors MT3 and MT4 and first and second NMOS transistors MT1 and MT2. In an embodiment, the PMOS sense amplifier unit 143*p* (refer to FIG. 4) may include the first and second PMOS transistors MT3 and MT4. The NMOS sense amplifier unit 143*n* (refer to FIG. 4) may include the first and second NMOS transistors MT1 and MT2.

A first terminal end of the first PMOS transistor MT3 may be connected to the complementary sensing bit line SBLB, a second terminal end thereof may be connected to a first power node to which the first power signal LA is applied, and a gate thereof may be connected to the sensing bit line SBL.

A first terminal end of the second PMOS transistor MT4 may be connected to the sensing bit line SBL, a second terminal end thereof may be connected to the first power node to which the first power signal LA is applied, and a gate thereof may be connected to the complementary sensing bit line SBLB.

A first terminal end of the first NMOS transistor MT1 may be connected to the node N1-2 corresponding to the complementary sensing bit line SBLB, a second terminal end thereof may be connected to a second power node, to which the second power signal LAB is applied, through a node 1-1, and a gate thereof may be connected to the bit line BL.

A first terminal end of the second NMOS transistor MT2 may be connected to the node N2-2 corresponding to the sensing bit line SBL, a second terminal end thereof may be connected to the second power node, to which the second power signal LAB is applied, through a node N2-1, and a gate thereof may be connected to the complementary bit line BLB.

The bit line BL may be connected to a first terminal end of a driving switching included in the first memory cell MC1. The first word line WL1 may be connected to a gate of the driving switching included in the first memory cell MC1.

The sense amplifier unit 143 may further include a first equalization switch 143*a* and a second equalization switch 143*b*. The first equalization switch 143*a* may operate independently of the second equalization switch 143*b*.

The first equalization switch 143*a* may include a gate terminal of receiving a first equalization signal PEQ and may be connected between a third power node to which a third power signal VBL is applied and the node N2-2, and the second equalization switch 143*b* may include a gate terminal of receiving a second equalization signal EQ and may be connected between the node N1-2 and the node N2-2.

FIGS. 5 to 8 are circuit diagrams illustrating operations of the sense amplifier 140 according to embodiments of the present disclosure. The sense amplifier 140 disclosed in FIG. 5 may be an equivalent circuit of the sense amplifier 140 of FIG. 4. The sense amplifier 140 of FIG. 5 being an equivalent circuit of the sense amplifier 140 of FIG. 4 will be described prior to describing operations of the sense amplifier 140.

Figure 5:
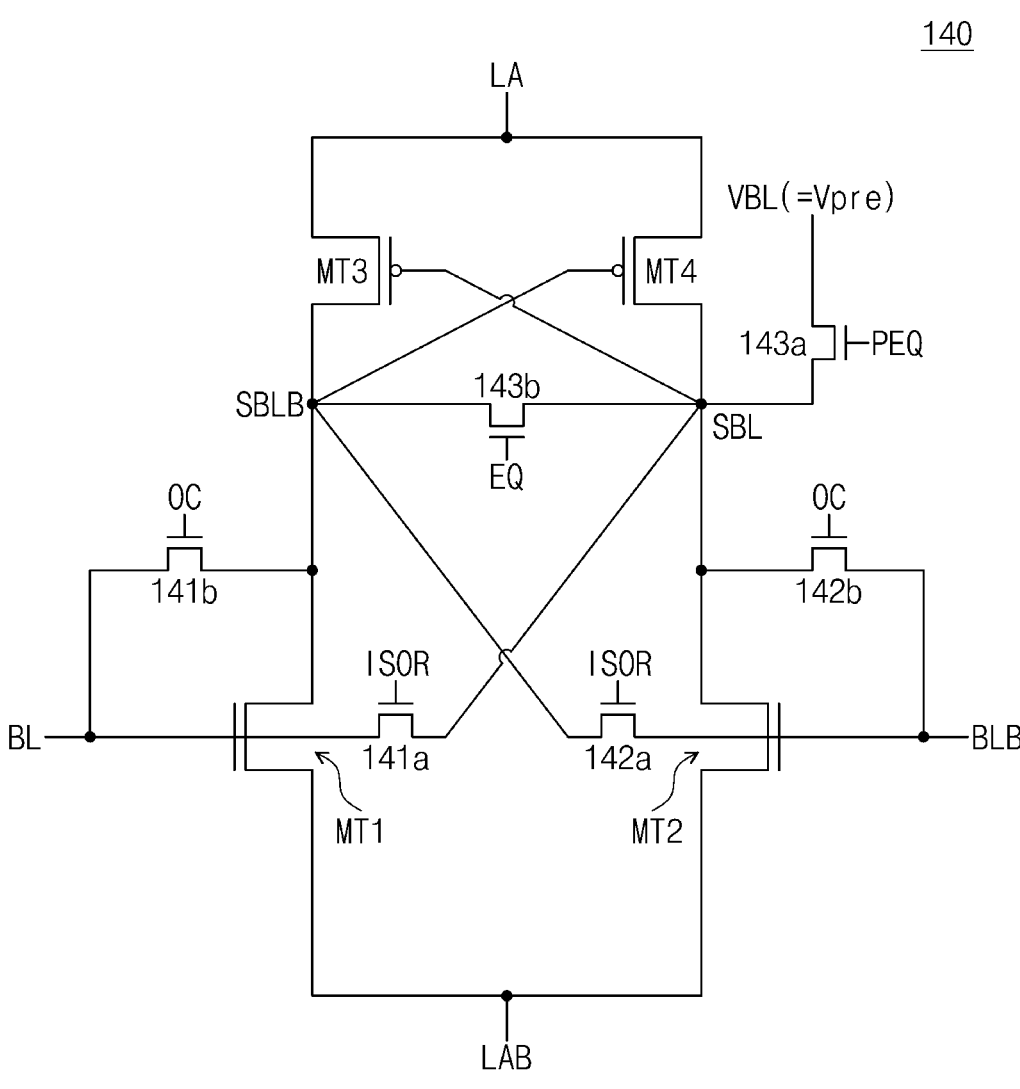
FIGS. 5 to 8 are circuit diagrams illustrating operations of a sense amplifier according to embodiments of the present disclosure.

Referring to FIGS. 5, the sense amplifier 140 may be an equivalent circuit of the sense amplifier 140. In FIGS. 4 and 5, components that are marked by the same reference numerals/signs may perform substantially the same functions. The sense amplifier 140 may include the first and second isolation switches 141*a* and 142*a*, the first and second offset cancellation switches 141*b* and 142*b*, the first and second PMOS transistors MT3 and MT4, the first and second NMOS transistors MT1 and MT2, and the first and second equalization switches 143*a* and 143*b*.

The sensing bit line SBL and the complementary sensing bit line SBLB of FIG. 4 may be expressed by nodes in FIG. 5. A node corresponding to the sensing bit line SBL of FIG. 4 may be referred to as a "first internal node", and a node corresponding to the complementary sensing bit line SBLB of FIG. 4 may be referred to as a "second internal node".

The second PMOS transistor MT4 may be connected between the first power node to which the first power signal LA is applied and the first internal node, and the first PMOS transistor MT3 may be connected between the first power node and the second internal node.

The first internal node may be connected to the drain terminal of the second NMOS transistor MT2, and the second internal node may be connected to the drain terminal of the first NMOS transistor MT1. The gate terminals of the first PMOS transistor MT3 and the second PMOS transistor MT4 may be cross coupled to the first internal node and the second internal node.

Below, operations of the sense amplifier 140 will be described. In FIG. 5, the sense amplifier 140 may be configured to perform the precharge operation, the offset cancellation operation, and the charge sharing operation. Below, the sensing bit line SBL may be expressed by a first sensing bit line SBL, and the complementary sensing bit line SBLB may be expressed by a second sensing bit line SBLB.

The sense amplifier 140 may be configured to perform the precharge operation.

The first and second equalization switches 143a and 143b, the first and second offset cancellation switches 141b and 142b, and the first and second isolation switches 141a and 142a may be configured to be turned on responsive to the first and second equalization signals PEQ and EQ, the offset cancellation signal OC, and the isolation signal ISOR.

The voltage level of each of the first and second power signals LA and LAB may be set to a first driving voltage (e.g., Vpre) being one of driving voltages of the memory device 100.

The voltage levels of the first and second sensing bit lines SBL and SBLB may be set to the first driving voltage. As the first and second isolation switches 141a and 142a are turned on and the first and second offset cancellation switches 141b and 142b are turned on, the first sensing bit line SBL may be short-circuited to the first bit line BL, the second sensing bit line SBLB may be short-circuited with the second bit line BLB, the second sensing bit line SBLB may be short-circuited with the first bit line BL, and the first sensing bit line SBL may be short-circuited with the second bit line BLB. Accordingly, the first and second bit lines BL and BLB may be precharged with the first driving voltage.

The sense amplifier 140 may be configured to perform the offset cancellation operation.

Each of the first and second equalization signals PEQ and EQ and the isolation signal ISOR may be maintained at the low level or may transition to the low level. The offset cancellation signal OC may be maintained at the high level. In this case, the first and second equalization switches 143a and 143b and the first and second isolation switches 141a and 142a may be turned off, and the first and second offset cancellation switches 141b and 142b may turned on.

The voltage level of the first power signal LA may transition to a first voltage level (e.g., VINTA) different from the first driving voltage, and the voltage level of the second power signal LAB may transition to a voltage level (e.g., VSS) different from the first driving voltage. When the offset cancellation operation is performed, the first voltage level VINTA may correspond to an input voltage, and the second voltage level VSS may correspond to a ground voltage.

The voltage levels of the first and second sensing bit lines SBL and SBLB may be between the first voltage level VINTA and the second voltage level VSS. For example, the voltage levels of the first and second sensing bit lines SBL and SBLB may be determined based on characteristic differences between the first and second NMOS transistors MT1 and MT2. For example, characteristic differences between the first and second NMOS transistors MT1 and MT2 may occur due to PVT variations.

As the first and second offset cancellation switches 141b and 142b are turned on, the first sensing bit line SBL may be short-circuited to the second bit line BLB, and the second sensing bit line SBLB may be short-circuited to the first bit line BL.

In the case where there is no characteristic mismatch between the first and second NMOS transistors MT1 and MT2, offset compensation may not be required. However, in this case, the voltage levels of the first and second bit lines BL and BLB may be decreased as much as the threshold voltage of the first and second NMOS transistors MT1 and MT2.

The sense amplifier 140 may be configured to perform the charge sharing operation.

The second equalization signal EQ may transition to the high level or may be maintained at the high level. Each of the first equalization signal PEQ, the offset cancellation signal OC, and the isolation signal ISOR may be maintained at the low level or may transition to the low level. In this case, the second equalization switch 143b may be turned on. The first equalization switch 143a, the first and second offset cancellation switches 141b and 142b, and the first and second isolation switches 141a and 142a may be turned off.

The voltage level of the first power signal LA may transition from the first voltage level VINTA to the first driving voltage. The voltage level of the second power signal LAB may transition from the second voltage level VSS to the first driving voltage.

As the first equalization switch 143a is turned off, the first and second sensing bit lines SBL and SBLB may not have the first driving voltage. Because the voltage level of the first power signal LA transitions to the first driving voltage prior to the voltage level of the second power signal LAB, the voltage levels of the first and second sensing bit lines SBL and SBLB may transition from the voltage level formed after the offset cancellation operation, as much as a given voltage level.

As the second equalization switch 143b is turned on, the first and second sensing bit lines SBL and SBLB may have the same voltage level.

The voltage level of the first bit line BL may be determined based on a result of the charge sharing between the first memory cell MC1 and the first bit line BL connected to the first memory cell MC1.

In this case, a given voltage may be applied to the first word line WL1 connected to the first memory cell MC1, such that the cell capacitor of the first memory cell MC1 is connected to the first bit line BL. Because the second bit line BLB is complementary to the first bit line BL, the charge sharing may not be performed on data stored in the second memory cell MC2.

For example, in the case where data indicating a logical value of "1" are stored in the first memory cell MC1 (i.e., in the case where cell data are "1"), the voltage level of the first bit line BL may be increased as much as a given voltage level (e.g., "V" of FIG. 2) compared to the voltage level (e.g., Voc of FIG. 2) formed immediately after the offset cancellation operation is performed.

Although not illustrated, in the case where data indicating a logical value of "0" are stored in the first memory cell MC1 in (i.e., in the case where cell data are "0"), the voltage level of the first bit line BL may be decreased as much as a given voltage level compared to the voltage level (e.g., Voc of FIG. 2) formed immediately after the offset cancellation operation is performed.

Figure 6:
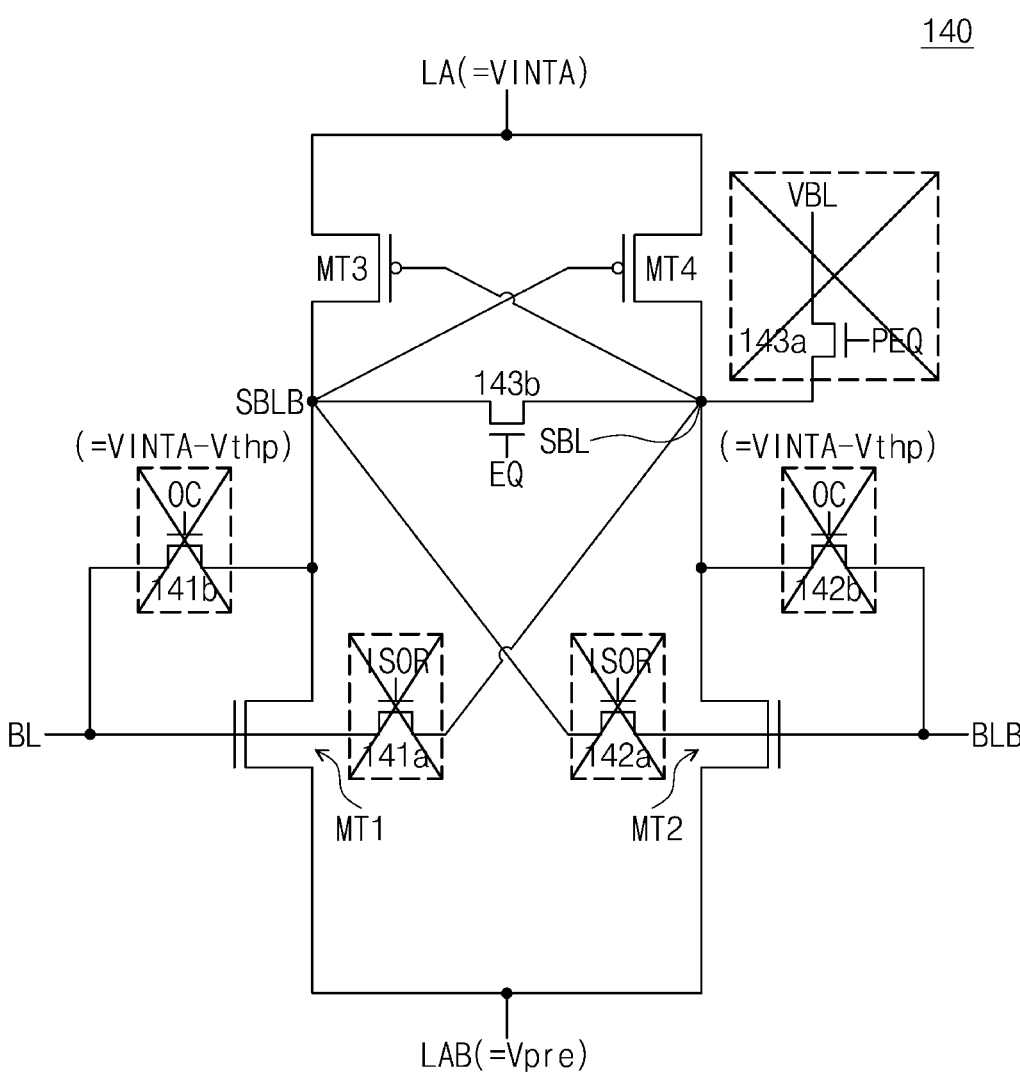

Referring to FIG. 6, the sense amplifier 140 may be configured to perform the precharge operation. However, the precharge operation described with reference to FIG. 6 may refer to an operation of charging the first and second internal nodes, which is described with reference to FIG. 5. Below, an operation of charging the first and second internal nodes may be referred to as a "second precharge operation".

Each of the first and second equalization signals PEQ and EQ, the offset cancellation signal OC, and the isolation signal ISOR may be maintained at a level identical to the level set after the charge sharing operation. In this case, the first and second equalization switches 143a and 143b, the first and second offset cancellation switches 141b and 142b, and the first and second isolation switches 141a and 142a may be maintained in a state identical to the state after the charge sharing operation.

The voltage level of the first power signal LA may transition from the first driving voltage to the first voltage level VINTA, and the voltage level of the second power signal LAB may be maintained at the first driving voltage.

Accordingly, the first and second internal nodes may be charged to a voltage level higher than the voltage level formed in the charge sharing operation. However, due to a threshold voltage Vthp of the first and second PMOS transistors MT3 and MT4, each of the first and second internal nodes may be charged to a level (VINTA–Vthp) lower than the first voltage level VINTA of the first power signal LA. That is, the first and second internal nodes may not be charged to a desired voltage level before the pre-sensing operation.

Figure 7:
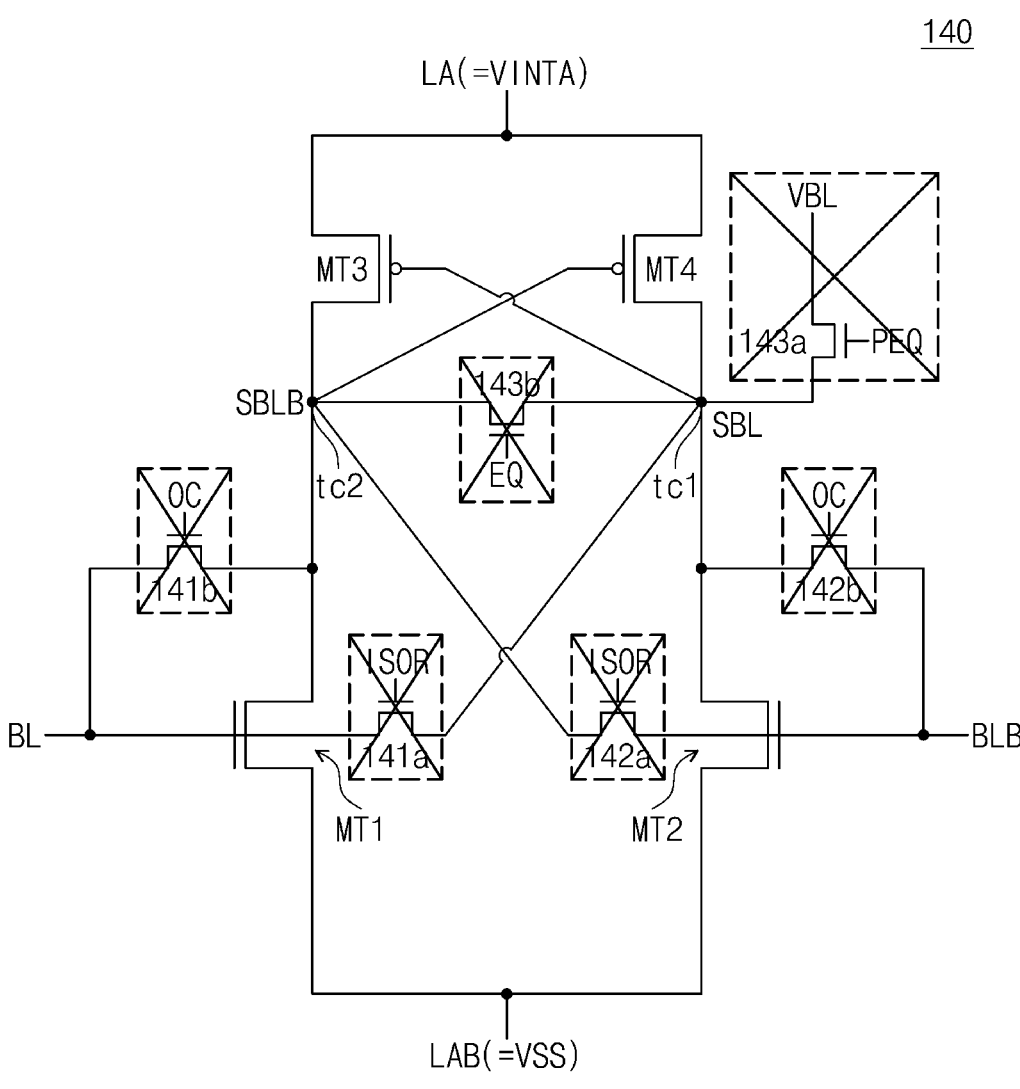

Referring to FIG. 7, the sense amplifier 140 may be configured to perform the pre-sensing operation.

Each of the first equalization signal PEQ, the offset cancellation signal OC, and the isolation signal ISOR may be maintained at a level identical to the level set after the second precharge operation. In this case, the first equalization switch 143a, the first and second offset cancellation switches 141b and 142b, and the first and second isolation switches 141a and 142a may be maintained in a state identical to the state after the second precharge operation.

The second equalization signal EQ may transition to the low level or may be maintained at the low level. In this case, the second equalization switch 143b may be turned off.

The voltage level of the first power signal LA may be maintained at the first voltage level VINTA, and the voltage level of the second power signal LAB may transition from the first driving voltage to the second voltage level VSS.

Because the voltage level of the first bit line BL is increased by the charge sharing, the first NMOS transistor MT1 may be turned on more strongly than the second NMOS transistor MT2.

A magnitude of a current flowing through the first NMOS transistor MT1 is greater than a magnitude of a current flowing through the second NMOS transistor MT2, and a drain-source voltage of the first NMOS transistor MT1 is smaller than a drain-source voltage of the second NMOS transistor MT2 (or a resistance component of the first NMOS transistor MT1 may be smaller than a resistance component of the second NMOS transistor MT2). As the voltage level of the first sensing bit line SBL increases and the voltage level of the second sensing bit line SBLB decreases, the pre-sensing operation may be performed.

However, when the second equalization switch 143b is turned off, the voltage levels of the first and second internal nodes may be different from each other due to a difference between the amount of charges present in the first internal node and the amount of charges present in the second internal node.

The charge amount difference may occur as charges accumulated in a parasitic capacitor included in the first equalization switch 143a are leaked out to the first internal node.

That is, the difference between the amount of charges accumulated in the first internal node and the amount of charges accumulated in the second internal node may be caused by the asymmetric structure of the sense amplifier 140. In this case, the sensing sensitivity of the sense amplifier 140 may be markedly degraded.

Figure 8:
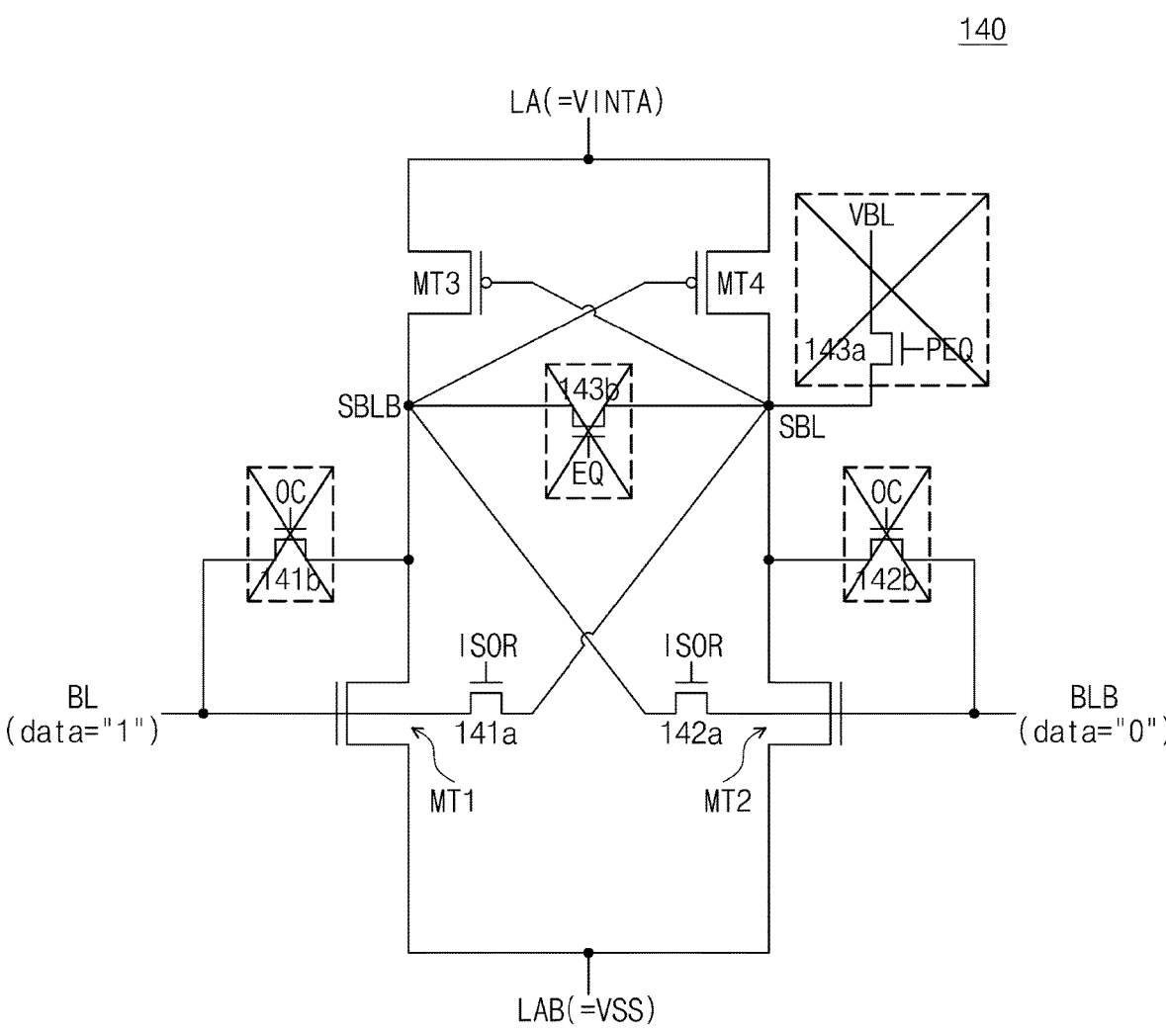

Referring to FIG. 8, the sense amplifier 140 may be configured to perform the restore operation.

Each of the first and second equalization signals PEQ and EQ and the offset cancellation signal OC may be maintained at the low level. The isolation signal ISOR may transition to the high level. In this case, the first and second equalization switches 143a and 143b and the first and second offset cancellation switches 141b and 142b may be turned off, and the first and second isolation switches 141a and 142a may be turned on.

The voltage level of the first power signal LA may be maintained at the first voltage level VINTA, and the voltage level of the second power signal LAB may be maintained at the second voltage level VSS.

As the first and second isolation switches 141a and 142a are turned on, the first sensing bit line SBL may be short-circuited to the first bit line BL, and the second sensing bit line SBLB may be short-circuited to the second bit line BLB.

The first NMOS transistor MT1 and the first PMOS transistor MT3 may constitute a first inverter, the second NMOS transistor MT2 and the second PMOS transistor MT4 may constitute a second inverter, and a latch structure may be formed by the first inverter and the second inverter.

The voltage level of the first bit line BL and the first sensing bit line SBL may increase to the first voltage level VINTA, a voltage level less than or equal to the first voltage level VINTA, or a voltage level greater than or equal to the first voltage level VINTA, and the voltage level of the second bit line BLB and the second sensing bit line SBLB may decrease to the second voltage level VSS, a voltage level less than or equal to the second voltage level VSS, or a voltage level greater than or equal to the second voltage level VSS. In this case, the restore operation may be performed.

Figure 9:
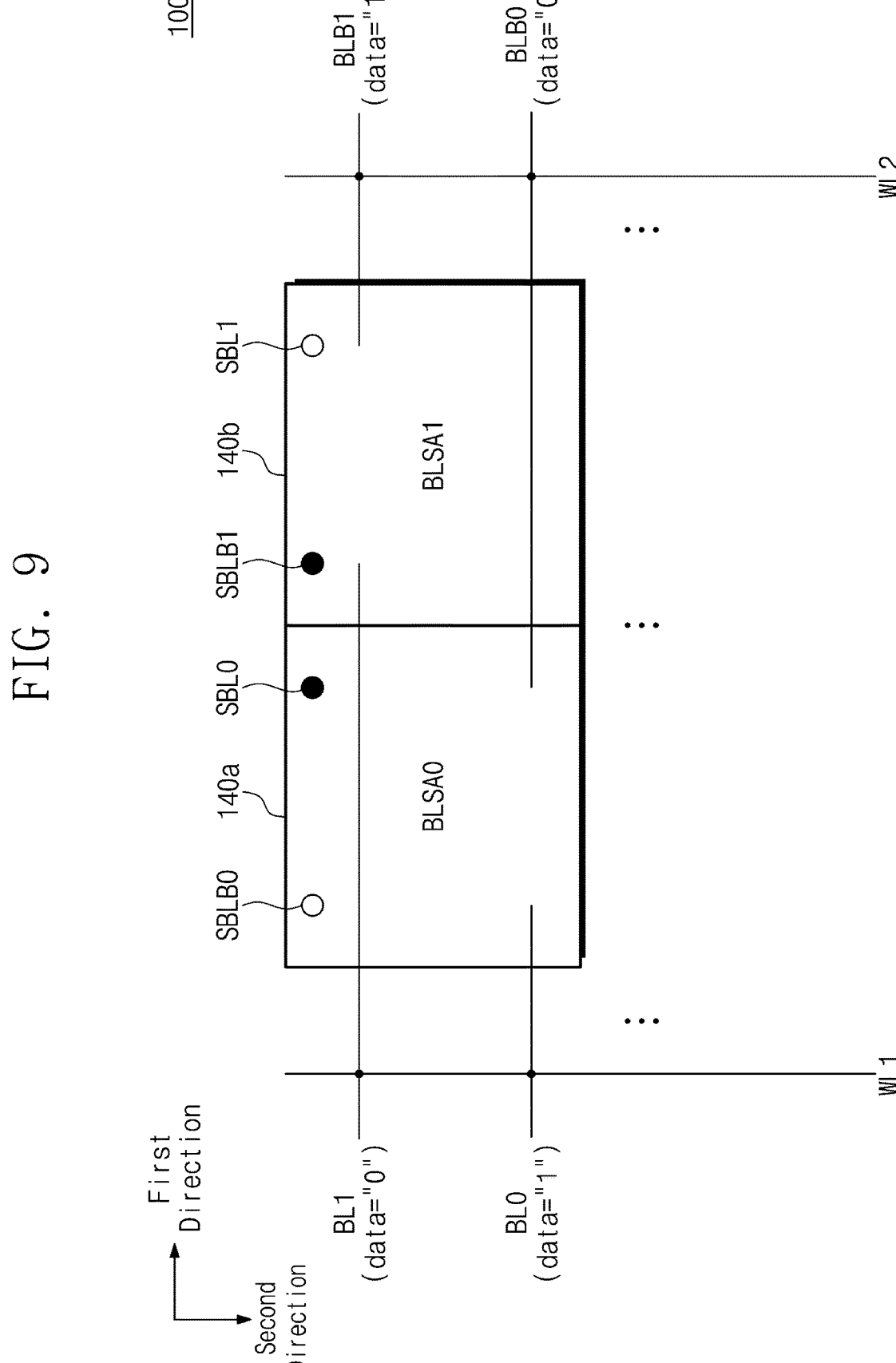
FIG. 9 is a diagram illustrating a layout of sense amplifiers in a memory device according to embodiments of the present disclosure.

FIG. 9 is a diagram illustrating a layout of sense amplifiers in the memory device 100 according to embodiments of the present disclosure.

Referring to FIGS. 5 to 9, the memory device 100 may include a first sense amplifier (BLSA 0) 140a and a second sense amplifier (BLSA 1) 140b.

The second sense amplifier 140b may be disposed adjacent to the first sense amplifier 140a in the first direction, that is, in a direction facing away from the first sense amplifier 140a.

As in the above placement of the first sense amplifier 140a and the second sense amplifier 140b, the remaining sense amplifiers may be arranged in the second direction perpendicular to the first direction by two. However, the placement of sense amplifiers is not limited thereto in accordance with different embodiments.

The first sense amplifier 140a and the second sense amplifier 140b will be described with reference to FIG. 9. Sense amplifiers disposed in the second direction with respect to the first sense amplifier 140a (i.e., in a direction facing away from the first sense amplifier 140a) may include the same configuration as the first sense amplifier 140a. Sense amplifiers disposed in the second direction with respect to the second sense amplifier 140b (i.e., in a direction facing away from the second sense amplifier 140b) may include the same configuration as the second sense amplifier 140b.

The first sense amplifier 140a may be connected to a first bit line BL0 and a second bit line BLB0 that are complementary to each other. The first sense amplifier 140a may be configured to sense a voltage difference of the first bit line BL0 and the second bit line BLB0 through a first sensing bit line SBL0 and a second sensing bit line SBLB0 that are complementary to each other.

The first sense amplifier 140a may include the first equalization switch connected to the first sensing bit line SBL0. The equalization switch may operate in response to the first equalization signal PEQ. In the first sense amplifier 140a, the second sensing bit line SBLB0 may not be connected to the first equalization switch.

The second sense amplifier 140b may be connected to a third bit line BL1 and a fourth bit line BLB1 that are complementary to each other. The second sense amplifier 140b may be configured to sense a voltage difference of the third bit line BL1 and the fourth bit line BLB1 through a third sensing bit line SBL1 and a fourth sensing bit line SBLB1 that are complementary to each other.

Unlike the configuration of the first sense amplifier 140a, in the second sense amplifier 140b, the first equalization switch may not be connected to the third sensing bit line SBL1. The second sense amplifier 140b may include the first equalization switch connected to the fourth sensing bit line SBLB1.

Data having a first logical value (e.g., "1") may be stored in a memory cell connected to the first bit line BL0. Data having a second logical value (e.g., "0") may be stored in a memory cell connected to the second bit line BLB0.

Likewise, data having the first logical value (e.g., "1") may be stored in a memory cell connected to the fourth bit line BLB1. Data having the second logical value (e.g., "0") may be stored in a memory cell connected to the third bit line BL1.

The first sense amplifier 140a may be configured to perform the first precharge operation and the offset cancellation operation. When the first word line WL1 is activated, the first sense amplifier 140a may be configured to read and store data of the memory cell connected to the first bit line BL0 by performing the following based on a voltage change of the first bit line BL0: a charge sharing operation, a second precharge operation, a pre-sensing operation, and a restore operation.

The second sense amplifier 140b may be configured to perform the first precharge operation and the offset cancellation operation. When the first word line WL1 is activated, the second sense amplifier 140b may be configured to read and store data of the memory cell connected to the third bit line BL1 by performing the following based on a voltage change of the third bit line BL1: a charge sharing operation, a second precharge operation, a pre-sensing operation, and a restore operation.

In this case, when the first word line WL1 is activated, data of different logical values may be respectively read and stored by the first sense amplifier 140a and the second sense amplifier 140b.

When the second word line WL2 is activated, the first sense amplifier 140a may be configured to read and store data of the memory cell connected to the second bit line BLB0 by performing the following based on a voltage change of the second bit line BLB0: a charge sharing operation, a second precharge operation, a pre-sensing operation, and a restore operation.

When the second word line WL2 is activated, the second sense amplifier 140b may be configured to read and store data of the memory cell connected to the fourth bit line BLB1 by performing the following based on a voltage change of the fourth bit line BLB1: a charge sharing operation, a second precharge operation, a pre-sensing operation, and a and restore operation.

In this case, when the second word line WL2 is activated, data of different logical values may be respectively read and stored by the first sense amplifier 140a and the second sense amplifier 140b.

Below, a sense amplifier with a bilateral symmetric structure will be described with reference to FIGS. 10 to 15.

Figure 10:
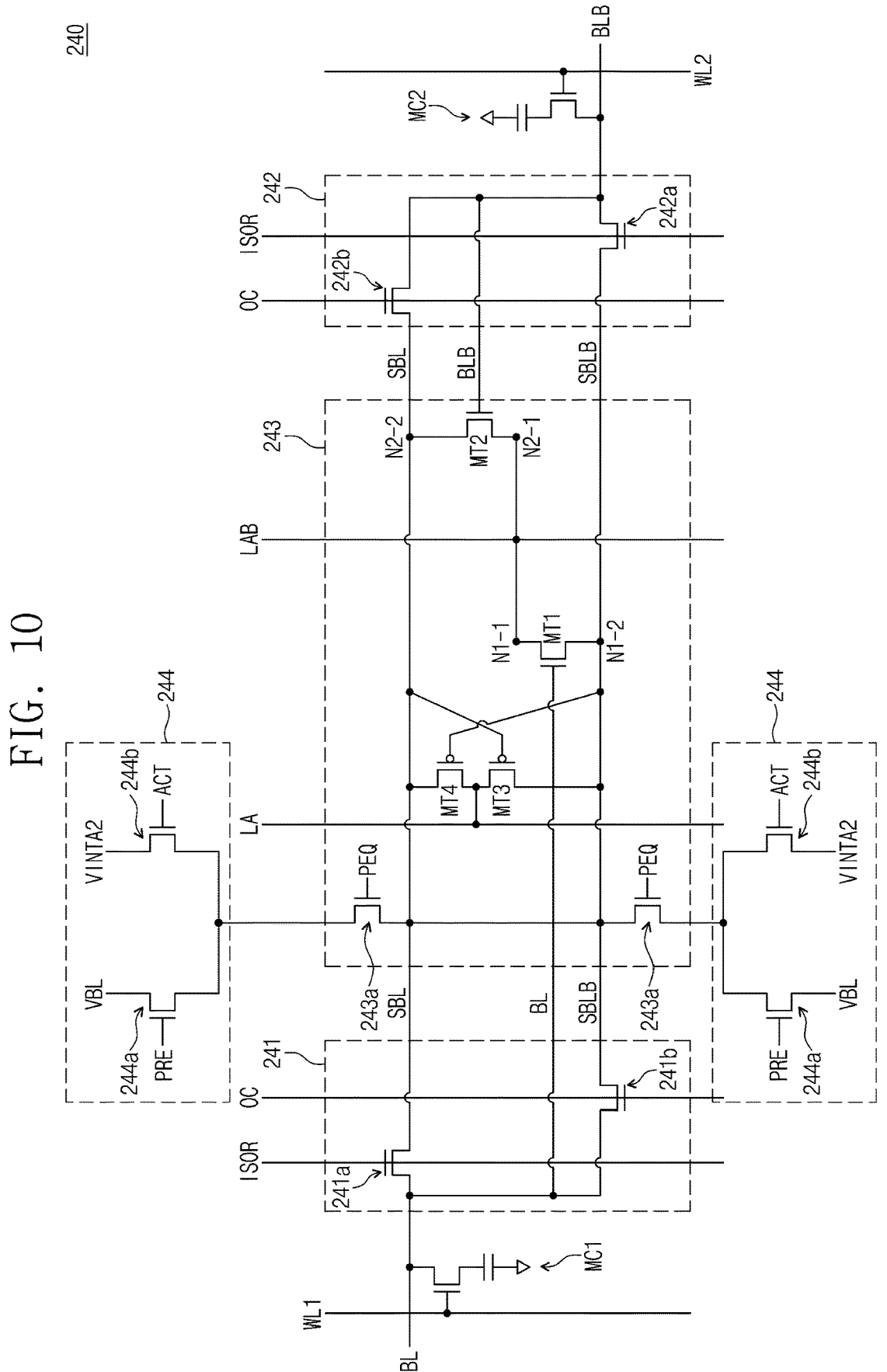
FIG. 10 is a block diagram illustrating a sense amplifier in detail according to embodiments of the present disclosure.

FIG. 10 is a block diagram illustrating a sense amplifier 240 according to embodiments of the present disclosure in detail. The electronic device 1000 of FIG. 1 may include the sense amplifier 240 of FIG. 10.

Referring to FIG. 10, the sense amplifier 240 includes a first isolation/offset cancellation unit 241, a second isolation/offset cancellation unit 242, and a sense amplifier unit 243. The first isolation/offset cancellation unit 241 may include a first isolation switch 241a and a first offset cancellation switch 241b. The second isolation/offset cancellation unit 242 may include a second isolation switch 242a and a second offset cancellation switch 242b. The sense amplifier unit 243 may include the first and second PMOS transistors MT3 and MT4 and the first and second NMOS transistors MT1 and MT2. The above components are described with reference to FIG. 4, and thus, additional description will be omitted to avoid redundancy. Below, a difference between the sense amplifier 240 of FIG. 10 and the sense amplifier 140 of FIG. 4 will be mainly described.

The sense amplifier 240 may further include a conjunction (CJT) circuit 244. The conjunction circuit 244 may be connected to a first terminal end of an equalization switch connected between a node (corresponding to the third power node of FIG. 4) and the node N2-2 from among equalization switches 243a.

Below, the node corresponding to the third power node of FIG. 3 may be referred to as a "third internal node".

The conjunction circuit 244 may include a precharge switch 244a and an activation switch 244b. However, the components included in the conjunction circuit 244 according to the present disclosure are not limited to the example of FIG. 10.

Each of the precharge switch 244a and the activation switch 244b may be implemented with one of an NMOS transistor or a PMOS transistor. Below, in FIGS. 10 to 15, the description will be given as the precharge switch 244a and the activation switch 244b are implemented with NMOS transistors.

A first terminal end of the precharge switch 244a may be connected to a fourth power node to which a second driving voltage VBL (e.g., Vpre) is applied, a second terminal end thereof may be connected to first terminal ends of the equalization switches 243a, and the precharge switch 244a may operate in response to a precharge signal PRE applied to a gate terminal thereof.

A first terminal end of the activation switch 244b may be connected to a fifth power node to which a third driving voltage is applied, a second terminal end thereof may be connected to the first terminal ends of the equalization switches 243a, and the activation switch 244b may operate in response to an activation signal ACT applied to a gate terminal thereof.

For example, when FIGS. 5 to 8 are referenced, the precharge switch 244a may be turned on responsive to the precharge signal PRE in the first precharge operation. The precharge switch 244a may be turned off responsive to the precharge signal PRE in the offset cancellation operation, the charge sharing operation, the second precharge operation, the pre-sensing operation, and the restore operation.

The activation switch 244b may be turned off responsive to the activation signal ACT in the first precharge operation.

The activation switch 244b may be turned on responsive to the activation signal ACT in the offset cancellation operation, the charge sharing operation, the second precharge operation, the pre-sensing operation, and the restore operation. This will be described in detail with reference to FIGS. 11 to 15.

The sense amplifier unit 243 of FIG. 10 may include two equalization switches 243a that simultaneously operate in response to the same equalization signal PEQ. One equalization switch may include a gate terminal of receiving the equalization signal PEQ, may be connected between the third internal node and the node N2-2, and may operate in response to the equalization signal PEQ.

The other equalization switch may include a gate terminal for receiving the equalization signal PEQ, may be connected between the third internal node and the node N1-2, and may operate in response to the equalization signal PEQ. A connection relationship between the conjunction circuit 244 and the sense amplifier unit 243 will be described later.

FIGS. 11 to 15 are circuit diagrams illustrating operations of a sense amplifier according to embodiments of the present disclosure. The sense amplifiers 240 disclosed in FIGS. 11 to 15 may be equivalent circuits of the sense amplifier 240 of FIG. 10. Prior to describing operations of the sense amplifier 240, a difference between the sense amplifiers 240 of FIGS. 11 to 15 and the sense amplifiers 140 of FIGS. 5 to 8 will be mainly described.

Figure 15:
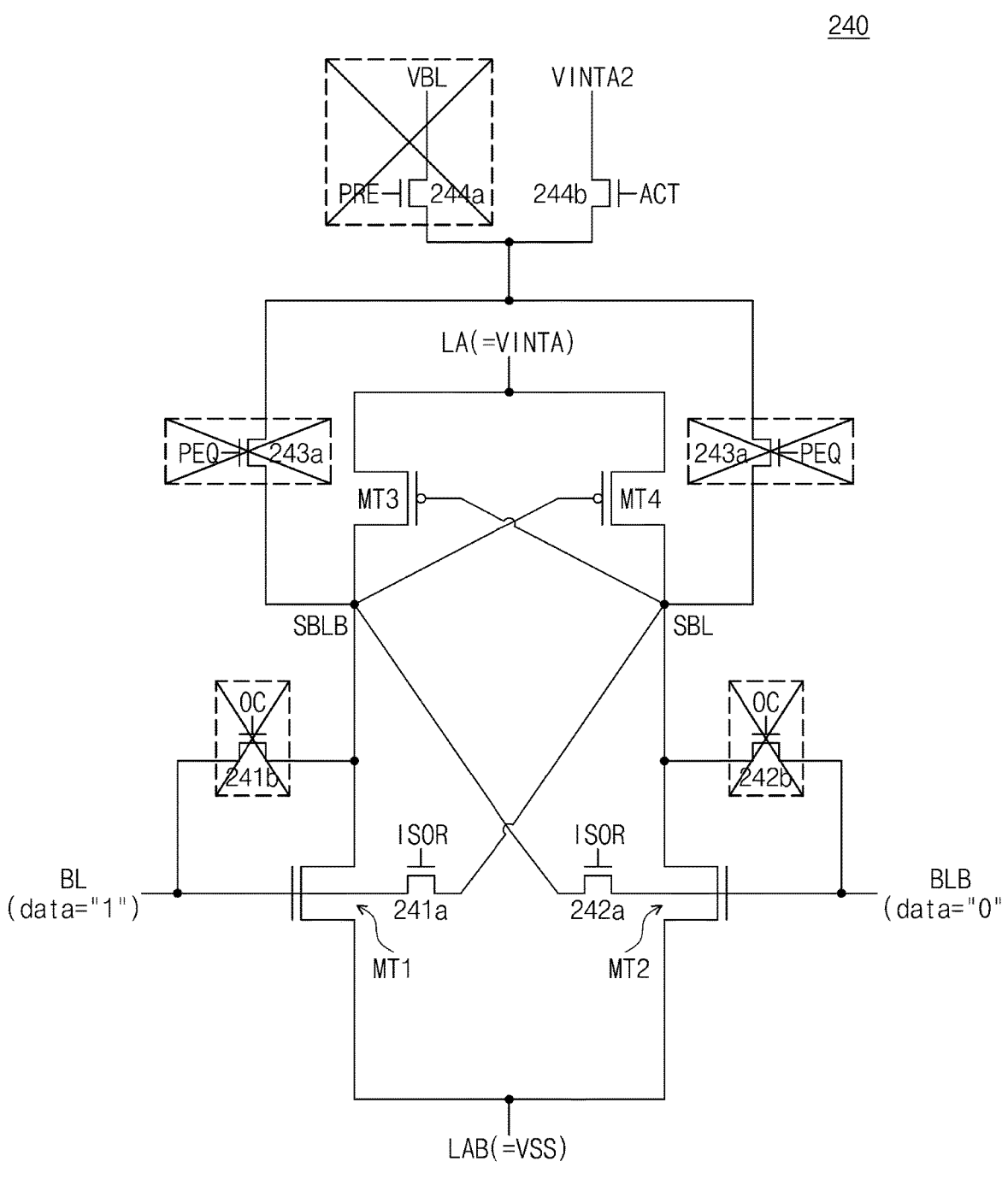

In FIGS. 10 and 15, components that are marked by the same reference numerals/signs may perform substantially the same functions. The sense amplifier 240 may include the first and second isolation switches 241a and 242a, the first and second offset cancellation switches 141b and 142b, the first and second PMOS transistors MT3 and MT4, the first and second NMOS transistors MT1 and MT2, the equalization switches 243a, the precharge switch 244a, and the activation switch 244b.

The sensing bit line SBL and the complementary sensing bit line SBLB of FIG. 10 may be expressed by nodes in FIGS. 11 to 15. A node corresponding to the sensing bit line SBL of FIG. 10 may be referred to as a "first internal node", and a node corresponding to the complementary sensing bit line SBLB of FIG. 10 may be referred to as a "second internal node".

A first terminal end of the precharge switch 244a may be connected to a first terminal end of each of the equalization switches 243a through the third internal node. A first terminal end of the activation switch 244b may be connected to the first terminal end of each of the equalization switches 243a through the third internal node.

Figure 11:
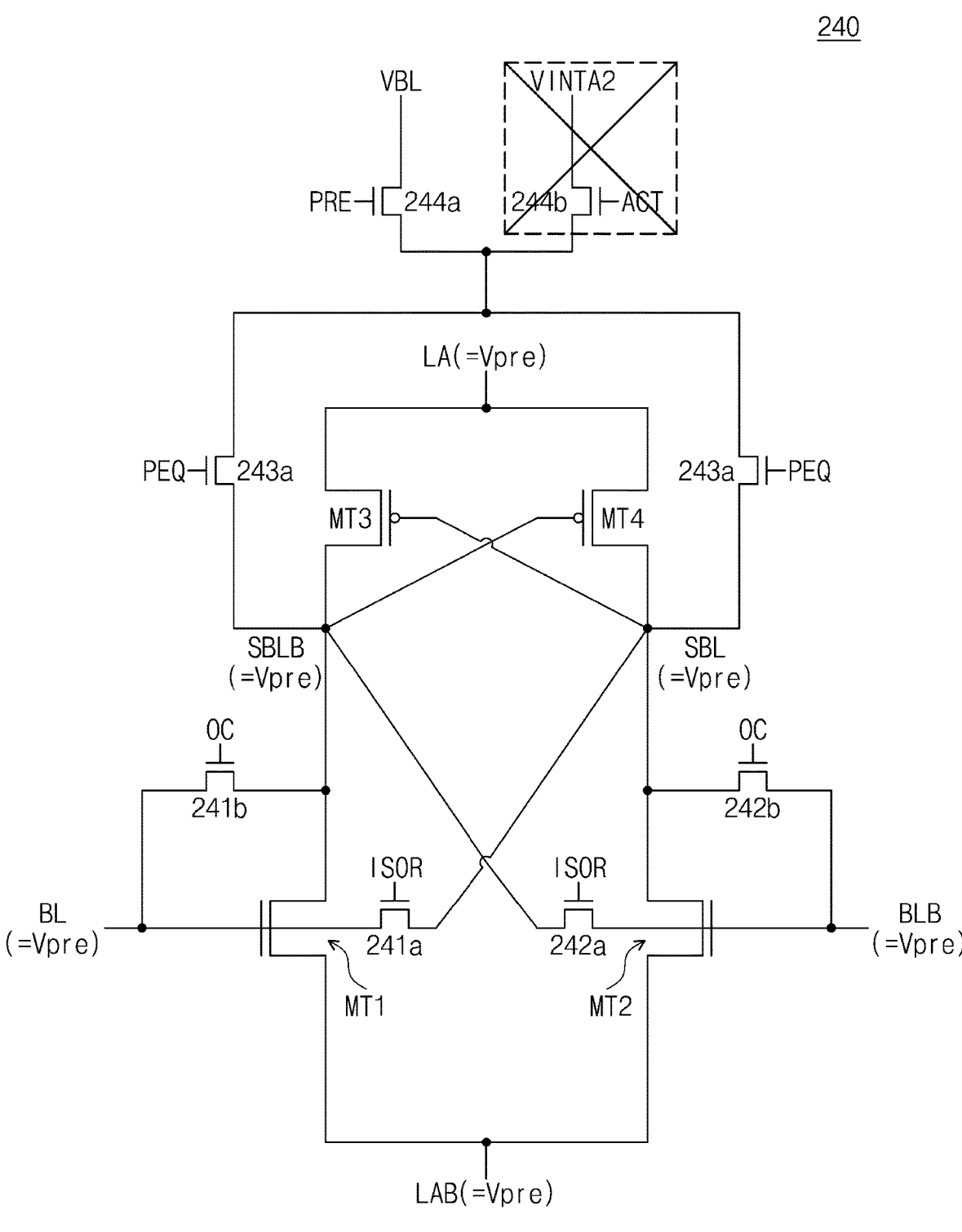
FIGS. 11 to 15 are circuit diagrams illustrating operations of a sense amplifier according to embodiments of the present disclosure.

Below, operations of the sense amplifier 240 will be described. In FIG. 11, the sense amplifier 240 may be configured to perform the precharge operation. Below, in FIGS. 11 to 15, the sensing bit line SBL may be expressed by the first sensing bit line SBL, and the complementary sensing bit line SBLB may be expressed by the second sensing bit line SBLB.

The precharge switch 244a, the equalization switches 243a, the first and second offset cancellation switches 241b and 242b, and the first and second isolation switches 241a and 242a may be turned on responsive to the precharge signal PRE, the equalization signal PEQ, the offset cancellation signal OC, and the isolation signal ISOR. In this case, the activation switch 244b may be turned off responsive to the activation signal ACT.

The voltage level of each of the first and second power signals LA and LAB may be set to a first driving voltage (e.g., Vpre) being one of driving voltages of the memory device 100.

As the precharge switch 244a and the equalization switches 243a are additionally turned on in addition to the first and second offset cancellation switches 241b and 242b and the first and second isolation switches 241a and 242a, the first and second sensing bit lines SBL and SBLB and the first and second bit lines BL and BLB may be precharged with the first driving voltage.

Figure 12:
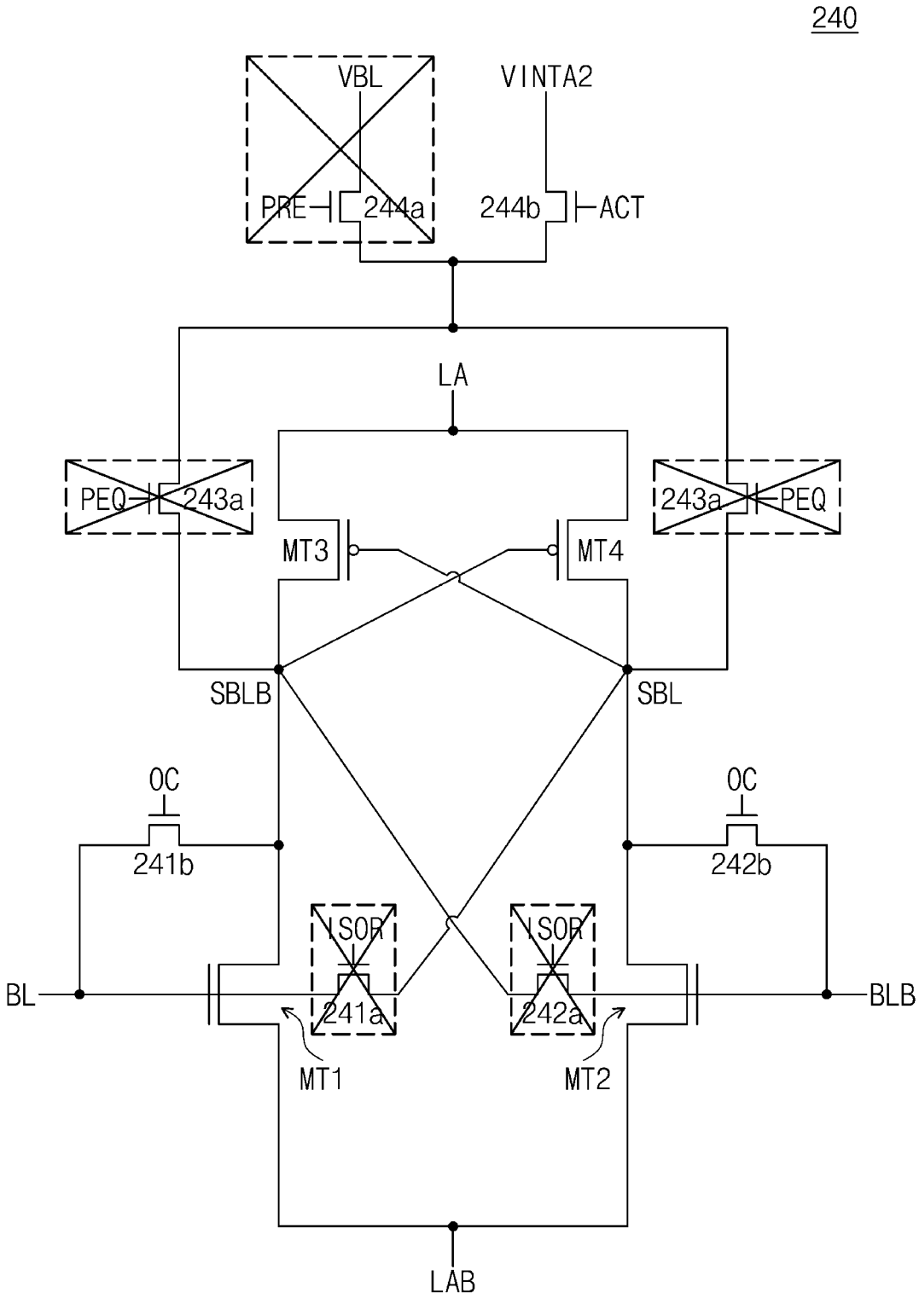

In FIG. 12, the sense amplifier 240 may be configured to perform the offset cancellation operation and the charge sharing operation. The sense amplifier 240 may be configured to perform the offset cancellation operation prior to the charge sharing operation.

A. 1. Offset Cancellation Operation

The equalization signal PEQ and the isolation signal ISOR may be maintained at the low level or may transition to the low level. The offset cancellation signal OC may be maintained at the high level. In this case, the equalization switches 243a and the first and second isolation switches 241a and 242a may be turned off, and the first and second offset cancellation switches 241b and 242b may be turned on.

The precharge signal PRE may transition to the low level. The activation signal ACT may transition to the high level. In this case, the precharge switch 244a may be turned off, and the activation switch 244b may be turned on.

The voltage level of the first power signal LA may transition to the first voltage level (e.g., VINTA), and the voltage level of the second power signal LAB may transition to the second voltage level (e.g., VSS). When the offset cancellation operation is performed, the first voltage level VINTA may correspond to an input voltage, and the second voltage level VSS may correspond to a ground voltage.

The voltage levels of the first and second sensing bit lines SBL and SBLB may be between the first voltage level VINTA and the second voltage level VSS.

As the activation switch 244b is turned on, the third driving voltage may be applied to the first and second sensing bit lines SBL and SBLB. The voltage level of the third driving voltage may be "VINTA2". Herein, "VINTA2" may be different in level from "VINTA" and "Vpre".

However, even though the activation switch 244b is turned on, because the equalization switches 243a are turned off, the voltage level of each of the first and second sensing bit lines SBL and SBLB may be decreased as much as a given voltage level.

As described with reference to FIG. 5, in the case where there is no mismatch of component characteristics between the first and second NMOS transistors MT1 and MT2, offset compensation may not be required. However, in this case, the voltage levels of the first and second bit lines BL and BLB may be decreased as much as the threshold voltage of the first and second NMOS transistors MT1 and MT2.

2. Charge Sharing Operation

Each of the equalization signal PEQ, the offset cancellation signal OC, and the isolation signal ISOR may be maintained at the low level or may transition to the low level. In this case, the equalization switches 243a, the first and second offset cancellation switches 241b and 242b, and the first and second isolation switches 241a and 242a may be turned off.

The precharge signal PRE may be maintained at the low level. The activation signal ACT may be maintained at the high level. In this case, the precharge switch 244a may maintain a turn-off state, and the activation switch 244b may maintain a turn-on state.

Like the offset cancellation operation, even though the activation switch 244b is turned on, because the equalization switches 243a are turned off, the third driving voltage may not be applied to the first and second sensing bit lines SBL and SBLB.

In this case, because the voltage level of the first power signal LA transitions to the first driving voltage prior to the voltage level of the second power signal LAB, the voltage levels of the first and second sensing bit lines SBL and SBLB may be decreased from the voltage level formed after the offset cancellation operation, as much as a given voltage level.

The voltage level of the first bit line BL may be determined based on a result of the charge sharing between the first memory cell MC1 and the first bit line BL connected to the first memory cell MC1. For example, in the case where data indicating a logical value of "1" are stored in the first memory cell MC1 (i.e., in the case where cell data are "1"), the voltage level of the first bit line BL may be increased as much as a given voltage level compared to the voltage level formed immediately after the offset cancellation operation is performed.

Because the first and second offset cancellation switches 241b and 242b are turned off, the voltage level of the second bit line BLB may be identical to the voltage level formed immediately after the offset cancellation operation or may somewhat change.

Figure 13:
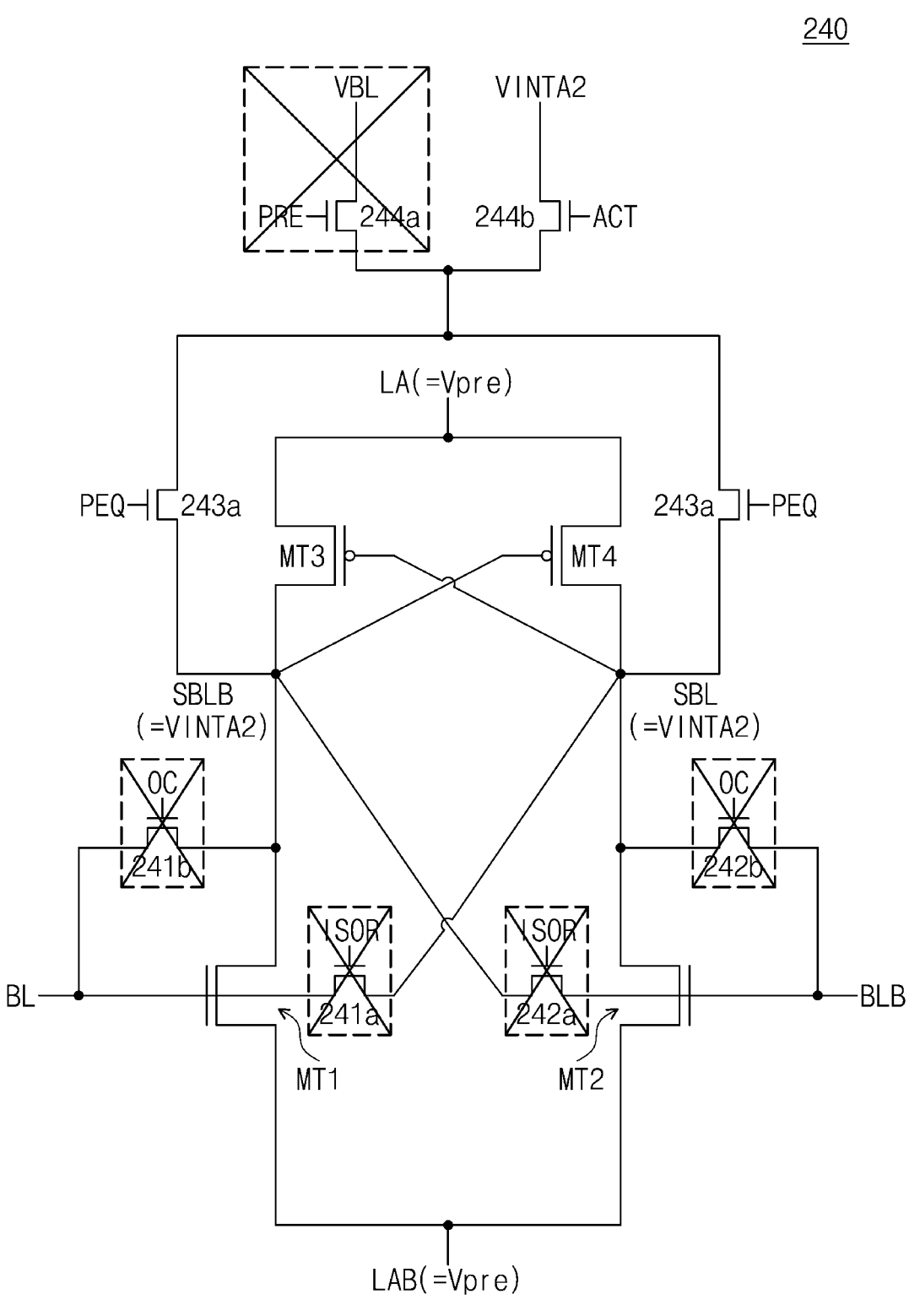

In FIG. 13, the sense amplifier 240 may be configured to perform the second precharge operation. Like FIG. 6, the second precharge operation may refer to an operation of charging the first and second internal nodes.

Each of the offset cancellation signal OC and the isolation signal ISOR may be maintained at a level identical to the level set after the charge sharing operation. In this case, the first and second offset cancellation switches 241b and 242b and the first and second isolation switches 241a and 242a may be maintained in a state identical to the state after the charge sharing operation.

The equalization signal PEQ and the activation signal ACT may be maintained at the high level or may transition to the high level. In this case, the equalization switches 243a may be turned on, and the activation switch 244b may maintain a turn-on state.

The voltage level of each of the first power signal LA and the second power signal LAB may be maintained at the first driving voltage. Accordingly, the voltage level charged at the first and second internal nodes may be realized regardless of the first and second power signals LA and LAB.

As the equalization switches 243a and the activation switch 244b are turned on, the first and second internal nodes may be precharged with a third driving voltage VINTA2. The voltage level of the third driving voltage VINTA2 may be higher or lower than the voltage level (VINTA–Vthp) of each of the first and second internal nodes, which is described with reference to FIG. 6. That is, the first and second internal nodes may be charged to an arbitrary level VINTA2 regardless of the voltage level of the first power signal LA before the pre-sensing operation.

Figure 14:
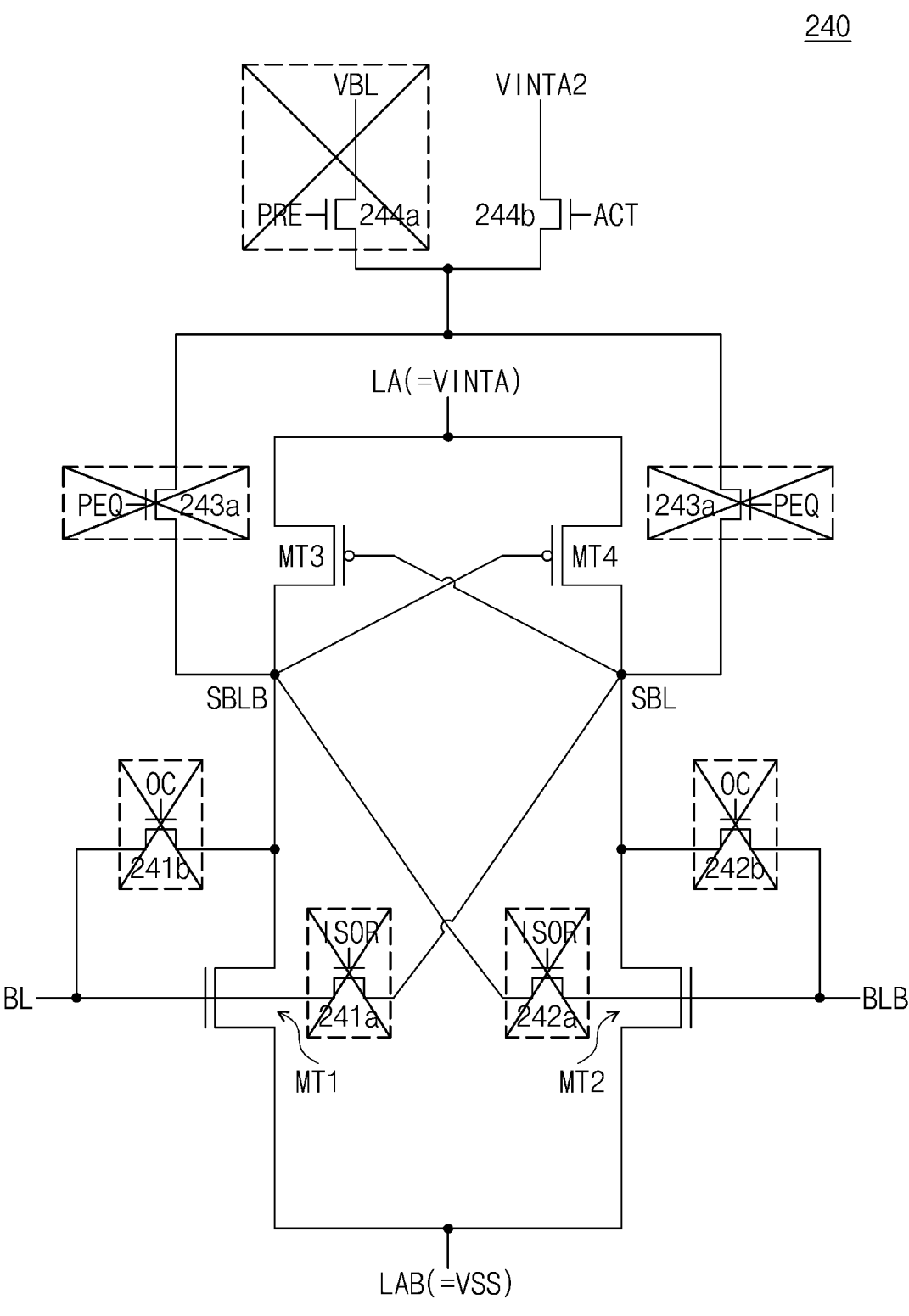

In FIG. 14, the sense amplifier 240 may be configured to perform the pre-sensing operation.

Each of the offset cancellation signal OC and the isolation signal ISOR may be maintained at a level identical to the level set after the second precharge operation. In this case, the first and second offset cancellation switches 241b and

242b and the first and second isolation switches 241a and 242a may be maintained in a state identical to the state after the second precharge operation.

The equalization signal PEQ may transition to the low level. The activation signal ACT may be maintained at the high level. In this case, the equalization switches 243a may be turned off, and the activation switch 244b may maintain a turn-on state.

The voltage level of the first power signal LA may transition from the first driving voltage to the first voltage level VINTA, and the voltage level of the second power signal LAB may transition from the first driving voltage to the second voltage level VSS.

The sense amplifier 240 may sense a voltage level change of the first bit line BL, which is made based on a result of the charge sharing operation. When the voltage level of the first bit line BL increases, the sense amplifier 240 may perform the pre-sensing operation based on how much the first NMOS transistor MT1 and the second NMOS transistor MT2 are turned on, that is, based on a difference between a magnitude of a current flowing through the first NMOS transistor MT1 and a magnitude of a current flowing through the second NMOS transistor MT2.

In FIG. 15, the sense amplifier 240 may be configured to perform the restore operation.

Each of the equalization signal PEQ and the offset cancellation signal OC may be maintained at the low level. The isolation signal ISOR may transition to the high level. In this case, the equalization switches 243a and the first and second offset cancellation switches 241b and 242b may be turned off, and the first and second isolation switches 241a and 242a may be turned on.

The precharge signal PRE may be maintained at the low level. The activation signal ACT may be maintained at the high level. In this case, the precharge switch 244a may maintain a turn-off state, and the activation switch 244b may maintain a turn-on state.

The voltage level of the first power signal LA may be maintained at the first voltage level VINTA, and the voltage level of the second power signal LAB may be maintained at the second voltage level VSS.

The sense amplifier 240 may read and store data present in the memory cell connected to the first sensing bit line SBL based on the voltage levels of the first and second sensing bit lines SBL and SBLB formed as a result of the pre-sensing operation (i.e., may perform the restore operation).

Figure 16A:
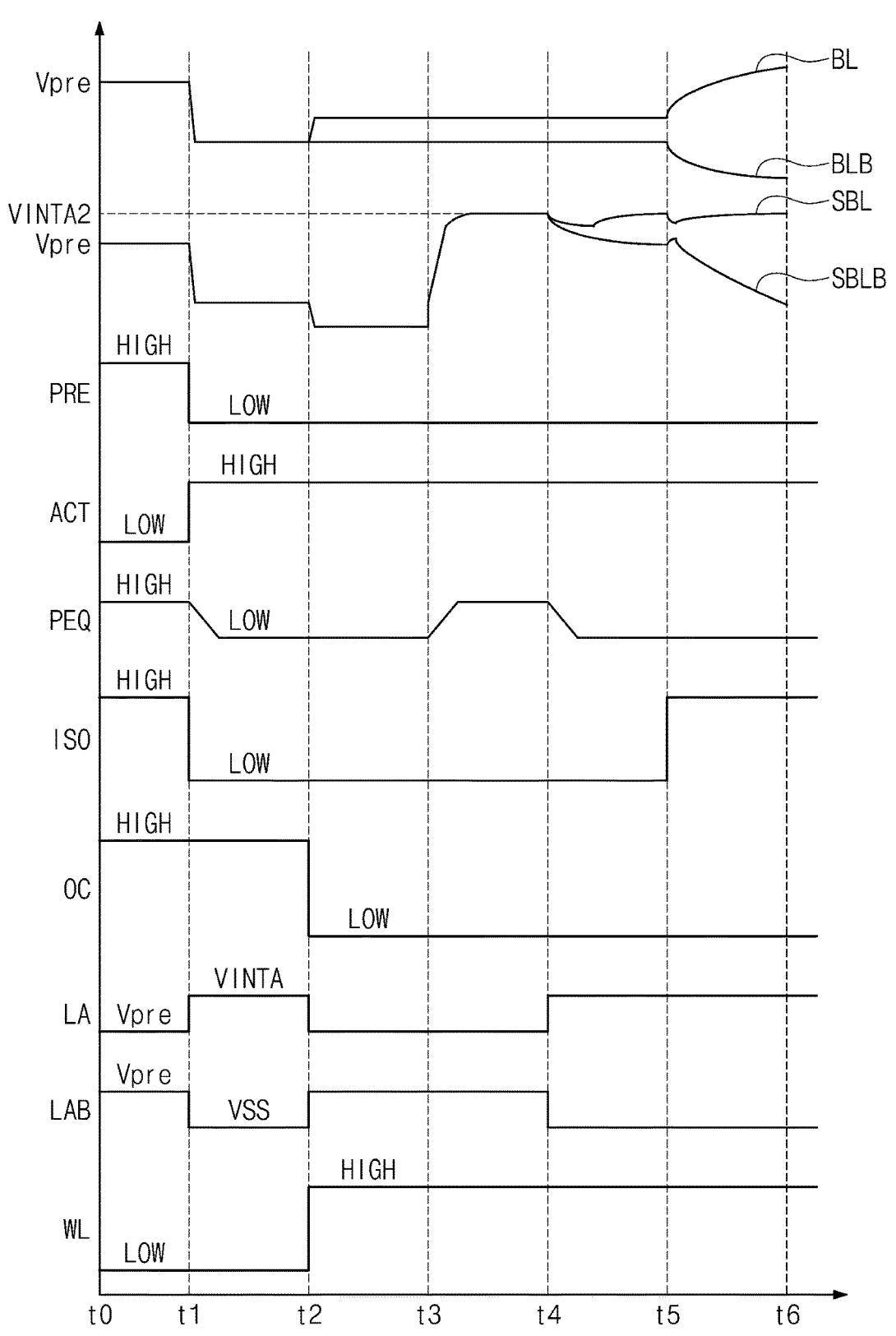
FIGS. 16A to 16C are timing diagrams illustrating control signals for controlling a sense amplifier according to embodiments of the present disclosure.
Figure 16B:
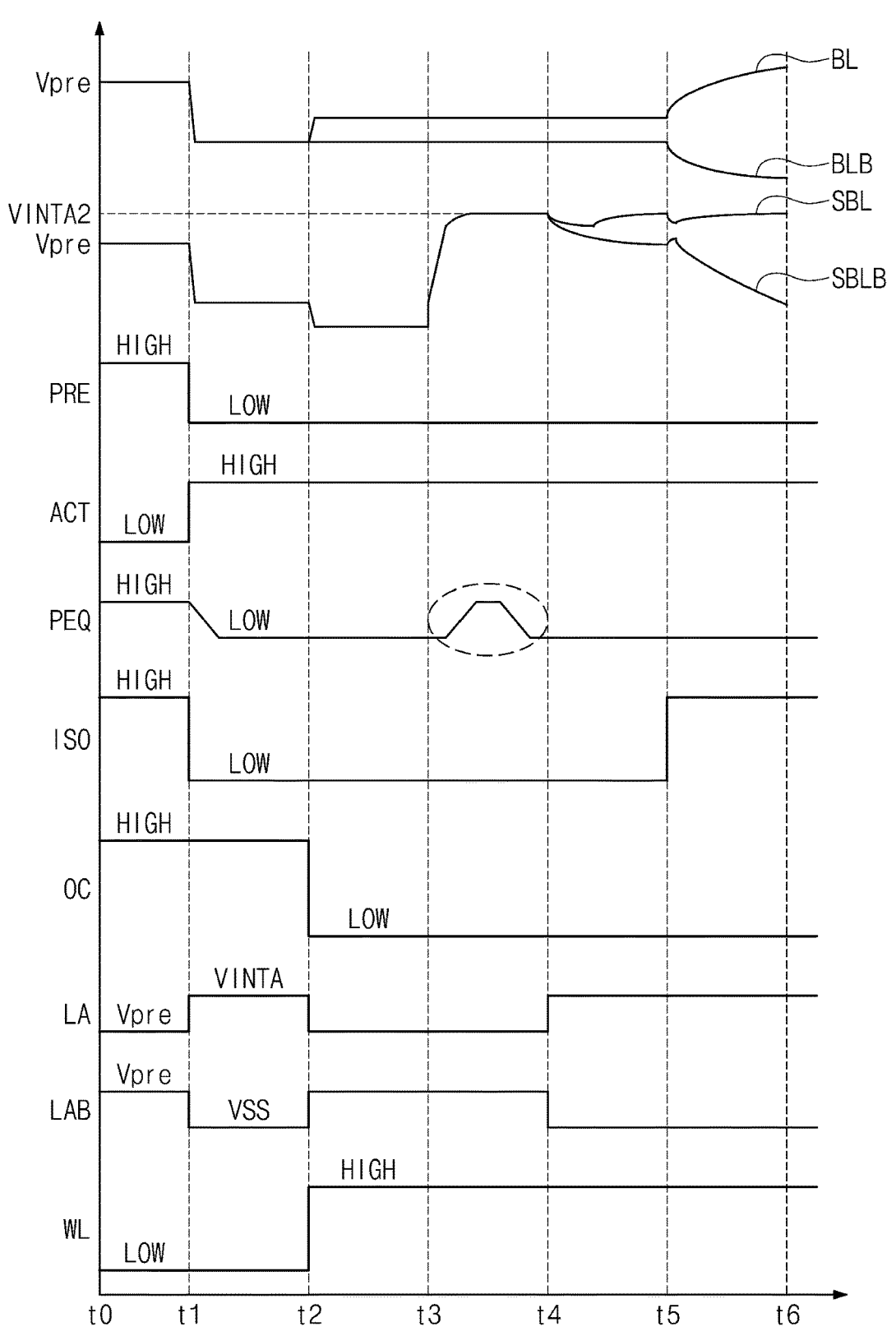
Figure 16C:
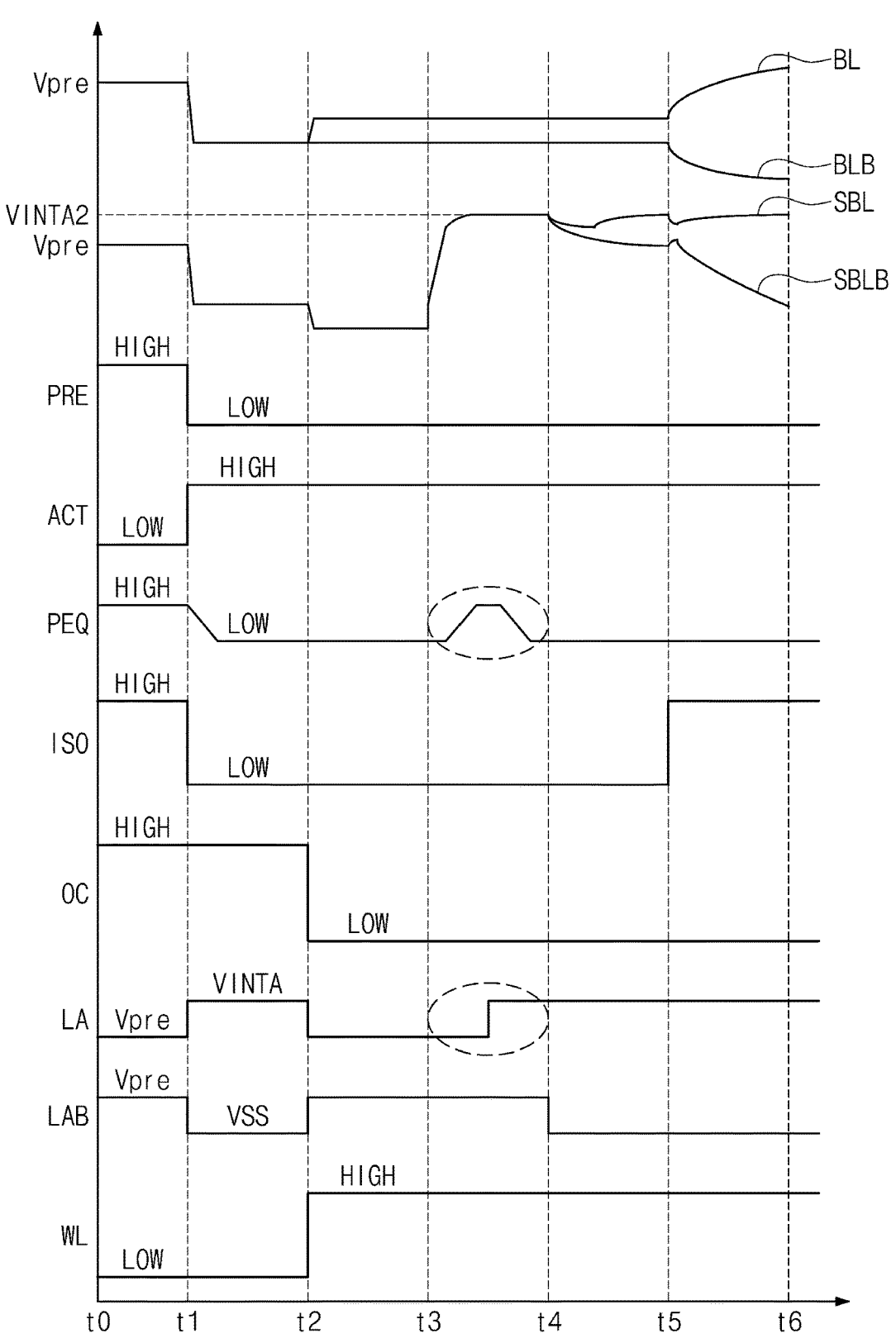

FIGS. 16A to 16C are timing diagrams illustrating control signals for controlling a sense amplifier according to embodiments of the present disclosure. In an embodiment, in FIGS. 16A to 16C, an X-axis represents a time, and a Y-axis represents a signal level. In an embodiment, the description will be given under the condition that the first memory cell MC1 stores data "1" and the first word line WL1 connected to the first bit line BL is activated. However, the present disclosure is not limited thereto.

Referring to FIGS. 16A to 16C, the sense amplifier 240 may sequentially perform the first precharge operation, the offset cancellation operation, the charge sharing operation, the second precharge operation, the pre-sensing operation, and the restore operation.

The first word line WL1 connected to the first bit line BL may be activated from the charge sharing operation. That is, in the first precharge operation and the offset cancellation operation, the first word line WL1 may be at the logic low level; in the charge sharing operation, the second precharge operation, the pre-sensing operation, and the restore operation, the first word line WL1 may transition to the logic high level.

First, in a first period from t0 to t1, the sense amplifier 240 may perform the first precharge operation. In this case, the precharge signal PRE, the equalization signal PEQ, the isolation signal ISOR, and the offset cancellation signal OC may be at the logic high level, and the first and second bit lines BL and BLB and the first and second sensing bit lines SBL and SBLB may be charged with the precharge voltage Vpre. The activation signal ACT may be at the logic low level, and thus, the third driving voltage VINTA2 may not be applied to the sense amplifier 240.

In this case, the voltage level of each of the first and second power signals LA and LAB may be set to a first driving voltage (e.g., Vpre), which is one of a plurality of driving voltages of the memory device 100.

Afterwards, in a second period from t1 to t2, the sense amplifier 240 may perform the offset cancellation operation. In this case, the precharge signal PRE, the equalization signal PEQ, and the isolation signal ISOR may be set to the logic low level, the activation signal ACT may be set to the logic high level, and the offset cancellation signal OC may be maintained at the logic high level. Even though the activation signal ACT is set to the logic high level, because the equalization signal PEQ is at the logic low level, the third driving voltage VINTA2 may not be applied to the sense amplifier 240.

The first power signal LA may transition from the precharge voltage Vpre to the input voltage VINTA, and the second power signal LAB may transition from the precharge voltage Vpre to the ground voltage VSS.

During the offset cancellation operation, the voltage levels of the first and second bit lines BL and BLB and the first and second sensing bit lines SBL and SBLB may be decreased as much as the threshold voltage of each of the transistors included in the sense amplifier 240.

As the offset cancellation signal OC is maintained at the logic high level, the first sensing bit line SBL may be short-circuited to the second bit line BLB, and the second sensing bit line SBLB may be short-circuited to the first bit line BL.

In a third period from t2 to t3, the sense amplifier 240 may perform the charge sharing operation. In this case, the offset cancellation signal OC may be set to the logic low level, the activation signal ACT may maintain the logic high level, the precharge signal PRE, and the equalization signal PEQ, and the isolation signal ISOR may maintain the logic low level.

Also, the first power signal LA may transition from the input voltage VINTA to the precharge voltage Vpre, and the second power signal LAB may transition from the ground voltage VSS to the precharge voltage Vpre.

As the first word line WL1 is activated, the charge sharing may be made between charges of the first bit line BL and charges stored in the first memory cell MC1.

When data "1" are stored in the first memory cell MC1 (i.e., when a voltage of the capacitor of the first memory cell MC1 is greater than or equal to a reference value), the voltage level of the first bit line BL may be increased as much as a given voltage level.

The voltage level of the first power signal LA may transition from the second voltage signal LAB prior to the voltage level of the second power signal LAB. In this case, the voltage levels of the first and second sensing bit lines SBL and SBLB may be decreased as much as a given voltage level from the voltage levels formed after the offset cancellation operation.

In a fourth period from t3 to t4, the sense amplifier 240 may perform the second precharge operation. In this case, the activation signal ACT may maintain the logic high level, and the precharge signal PRE, and the isolation signal ISOR, and the offset cancellation signal OC may maintain the logic low level.

Also, the voltage level of each of the first power signal LA and the second power signal LAB may be maintained at the first driving voltage.

As the equalization switches 243a and the activation switch 244b are turned on, the first and second sensing bit lines SBL and SBLB may be precharged with the third driving voltage VINTA2. The first and second sensing bit lines SBL and SBLB may be charged to the same voltage level.

For example, the voltage level of the third driving voltage VINTA2 may be higher than the voltage level (VINTA−Vthp) of each of the first and second internal nodes, which is described with reference to FIG. 6. That is, the first and second internal nodes may be charged to an arbitrary level VINTA2 regardless of the voltage level of the first power signal LA before the pre-sensing operation.

FIG. 16A shows the case where the equalization signal PEQ is at the logic high level in the entire fourth period from t3 to t4 and transitions to the logic low level after the pre-sensing operation starts. In this case, when the sense amplifier 240 performs the pre-sensing operation, the coupling may be caused between the first and second sensing bit lines SBL and SBLB.

Accordingly, as illustrated in FIG. 16B, before the second precharge operation ends, that is, before the period from t3 to t4 ends, the equalization signal PEQ may transition to the logic low level, and thus, the coupling between the first and second sensing bit lines SBL and SBLB may decrease.

In a fifth period from t4 to t5, the sense amplifier 240 may perform the pre-sensing operation.

In this case, the activation signal ACT may maintain the logic high level, and the precharge signal PRE, and the isolation signal ISOR, and the offset cancellation signal OC may maintain the logic low level.

The equalization signal PEQ may transition to the logic low level after the fifth period from t4 to t5 starts (FIG. 16A) or may transition to the logic low level before the fifth period from t4 to t5 starts (FIG. 16B).

The first power signal LA may transition from the precharge voltage Vpre to the input voltage VINTA, and the second power signal LAB may transition from the precharge voltage Vpre to the ground voltage VSS.

FIG. 16A shows the case where when the fifth period from t4 to t5 starts, the transition of the first power signal LA to the input voltage VINTA and the transition of the second power signal LAB to the ground voltage VSS are simultaneously made.

Semiconductor elements included in the sense amplifier 240 may be different in characteristic (e.g., threshold voltage) due to the process, voltage, and temperature (PVT) variations.

Accordingly, in the case of simultaneously changing the first power signal LA and the second power signal LAB, the first and second sensing bit lines SBL and SBLB may be charged to a level different from the third driving voltage VINTA2. That is, the performance of pre-sensing of the sense amplifier 240 may decrease.

Accordingly, as illustrated in FIG. 16C, when the first power signal LA first transitions to the input voltage VINTA before the pre-sensing operation starts, the first and second PMOS transistors MT3 and MT4 may first operate. Accordingly, the voltage change of the first bit line BL may be sensed more accurately, and the voltage levels of the first and second sensing bit lines SBL and SBLB may be adjusted.

Although not illustrated, when the second power signal LAB first transitions to the ground voltage VSS before the pre-sensing operation starts, the first and second NMOS transistors MT1 and MT2 may first operate. Even in this case, the voltage change of the first bit line BL may be sensed more accurately, and the voltage levels of the first and second sensing bit lines SBL and SBLB may be adjusted.

In a sixth period from t5 to t6, the sense amplifier 240 may perform the restore operation.

In this case, the activation signal ACT may maintain the logic high level, and the precharge signal PRE, the equalization signal PEQ, and the offset cancellation signal OC may maintain the logic low level.

The voltage level of the first power signal LA may be maintained at the first voltage level VINTA, and the voltage level of the second power signal LAB may be maintained at the second voltage level VSS.

When the isolation signal ISOR transitions to the logic high level, the first and second isolation switches 241a and 241b may be turned on. The first sensing bit line SBL may be short-circuited to the first bit line BL, and the second sensing bit line SBLB may be short-circuited to the second bit line BLB.

In this case, the sense amplifier 240 may charge or discharge the voltage level of the first sensing bit line SBL as much as the voltage level of the first bit line BL. For example, the first bit line BL and the first sensing bit line SBL may have the voltage level of the input voltage VINTA.

The sense amplifier 240 may charge or discharge the voltage level of the second sensing bit line SBLB as much as the voltage level of the second bit line BLB. For example, the second bit line BLB and the second sensing bit line SBLB may have the voltage level of the ground voltage VSS.

Figure 17:
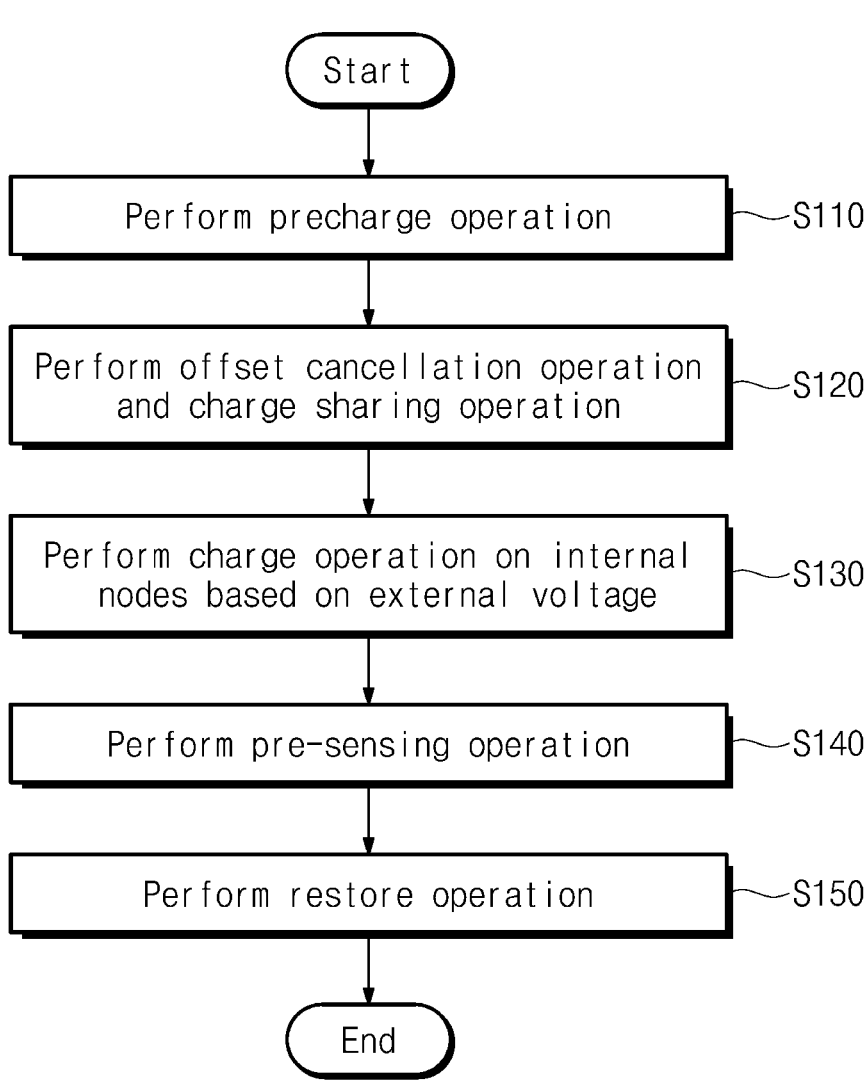
FIG. 17 is a flowchart illustrating a method of operating a sense amplifier, according to embodiments of the present disclosure.

FIG. 17 is a flowchart illustrating a method of operating the sense amplifier 240, according to embodiments of the present disclosure.

Referring to FIG. 17, in operation S110, the sense amplifier 240 may perform the precharge operation. In this case, the first and second bit lines BL and BLB and the first and second sensing bit lines SBL and SBLB may be connected to one node and may be charged with the precharge voltage Vpre.

In operation S120, the sense amplifier 240 may perform the offset cancellation operation and the charge sharing operation. In the specification, the offset cancellation operation may refer to an operation where voltage levels of the first and second bit lines BL and BLB and the first and second sensing bit lines SBL and SBLB transition based on a characteristic (e.g., a threshold voltage) of semiconductor elements.

The sense amplifier 240 may perform the charge sharing operation such that charges of a bit line associated with an activated word line among word lines and charges of a memory cell connected to the bit line are shared.

In operation S130, the sense amplifier 240 may perform the precharge operation on internal nodes based on an external voltage. The external voltage may indicate the third driving voltage VINTA2, and the precharge operation may refer to a voltage charging operation of the internal nodes.

In operation S140, the sense amplifier 240 may perform the pre-sensing operation. The sense amplifier 240 may form a voltage difference of the internal nodes charged to a desired level (e.g., VINTA2) based on a voltage change of the bit line.

In operation S150, the sense amplifier 240 may perform the restore operation. The sense amplifier 240 may generate the activated bit line and a deactivated bit line based on the voltage difference of the internal nodes thus formed.

Figure 18:
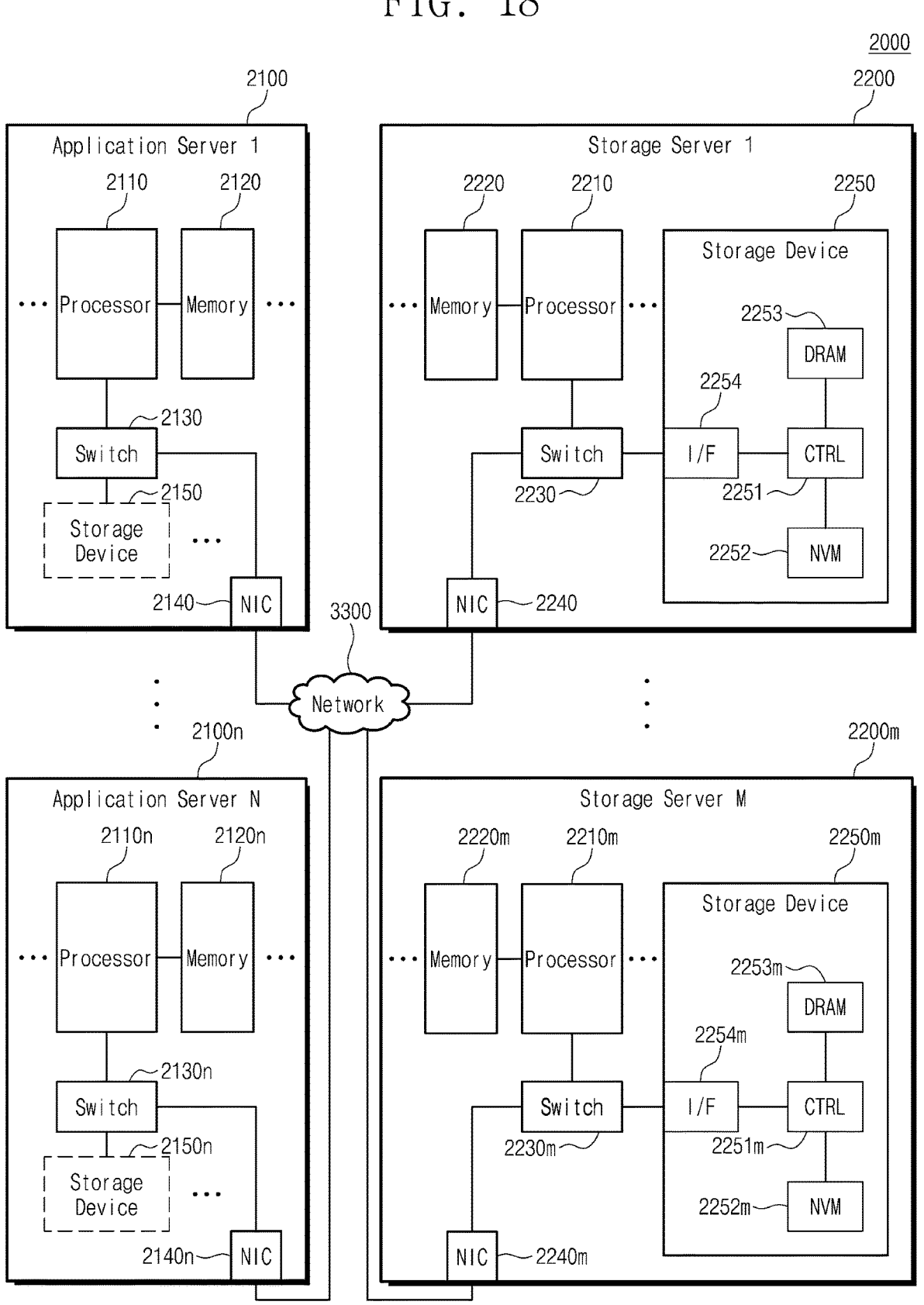
FIG. 18 is a diagram illustrating a data center to which a volatile memory device according to embodiments of the present disclosure is applied.

FIG. 18 is a diagram of a data center 2000 to which a memory device 100 is applied, according to embodiments of the present disclosure.

Referring to FIG. 18, the data center 2000 may be a facility that collects various types of pieces of data and provides services and be referred to as a data storage center. The data center 2000 may be a system for operating a search engine and a database, and may be a computing system used by companies, such as banks, or government agencies. The data center 2000 may include application servers 2100 to 2100n and storage servers 2200 to 2200m. The number of application servers 2100 to 2100n and the number of storage servers 2200 to 2200m may be variously selected according to embodiments. The number of application servers 2100 to 2100n may be different from the number of storage servers 2200 to 2200m.

The application server 2100 or the storage server 2200 may include at least one of processors 2110 and 2210 and memories 2120 and 2220. The storage server 2200 will now be described as an example. The processor 2210 may control all operations of the storage server 2200, access the memory 2220, and execute instructions and/or data loaded in the memory 2220. The memory 2220 may be a double-data-rate synchronous DRAM (DDR SDRAM), a high-bandwidth memory (HBM), a hybrid memory cube (HMC), a dual in-line memory module (DIMM), Optane DIMM, and/or a non-volatile DIMM (NVMDIMM). In some embodiments, the numbers of processors 2210 and memories 2220 included in the storage server 2200 may be variously selected. In an embodiment, the processor 2210 and the memory 2220 may provide a processor-memory pair. In an embodiment, the number of processors 2210 may be different from the number of memories 2220. The processor 2210 may include a single-core processor or a multi-core processor. The above description of the storage server 2200 may be similarly applied to the application server 2100. In some embodiments, the application server 2100 may not include a storage device 2150. The storage server 2200 may include at least one storage device 2250. The number of storage devices 2250 included in the storage server 2200 may be variously selected according to embodiments.

The application servers 2100 to 2100n may communicate with the storage servers 2200 to 2200m through a network 2300. The network 2300 may be implemented by using a fiber channel (FC) or Ethernet. In this case, the FC may be a medium used for relatively high-speed data transmission and use an optical switch with high performance and high availability. The storage servers 2200 to 2200m may be provided as file storages, block storages, or object storages according to an access method of the network 2300.

In an embodiment, the network 2300 may be a storage-dedicated network, such as a storage area network (SAN). For example, the SAN may be an FC-SAN, which uses an FC network and is implemented according to an FC protocol (FCP). As another example, the SAN may be an Internet protocol (IP)-SAN, which uses a transmission control protocol (TCP)/IP network and is implemented according to a SCSI over TCP/IP or Internet SCSI (iSCSI) protocol. In another embodiment, the network 2300 may be a general network, such as a TCP/IP network. For example, the network 2300 may be implemented according to a protocol, such as FC over Ethernet (FCoE), network attached storage (NAS), and NVMe over Fabrics (NVMe-oF).

Hereinafter, the application server 2100 and the storage server 2200 will mainly be described. A description of the application server 2100 may be applied to another application server 2100n, and a description of the storage server 2200 may be applied to another storage server 2200m.

The application server 2100 may store data, which is requested by a user or a client to be stored, in one of the storage servers 2200 to 2200m through the network 2300. Also, the application server 2100 may obtain data, which is requested by the user or the client to be read, from one of the storage servers 2200 to 2200m through the network 2300. For example, the application server 2100 may be implemented as a web server or a database management system (DBMS).

The application server 2100 may access a memory 2120n or a storage device 2150n, which is included in another application server 2100n, through the network 2300. Alternatively, the application server 2100 may access memories 2220 to 2220m or storage devices 2250 to 2250m, which are included in the storage servers 2200 to 2200m, through the network 2300. Thus, the application server 2100 may perform various operations on data stored in application servers 2100 to 2100n and/or the storage servers 2200 to 2200m. For example, the application server 2100 may execute an instruction for moving or copying data between the application servers 2100 to 2100n and/or the storage servers 2200 to 2200m. In this case, the data may be moved from the storage devices 2250 to 2250m of the storage servers 2200 to 2200m to the memories 2120 to 2120n of the application servers 2100 to 2100n directly or through the memories 2220 to 2220m of the storage servers 2200 to 2200m. The data moved through the network 2300 may be data encrypted for security or privacy.

The storage server 2200 will now be described as an example. An interface 2254 may provide physical connection between a processor 2210 and a controller 2251 and a physical connection between a Network InterConnect (NIC) 2240 and the controller 2251. For example, the interface 2254 may be implemented using a direct attached storage (DAS) scheme in which the storage device 2250 is directly connected with a dedicated cable. For example, the interface 2254 may be implemented by using various interface schemes, such as ATA, SATA, e-SATA, an SCSI, SAS, PCI, PCIe, NVMe, IEEE 1394, a USB interface, an SD card interface, an MMC interface, an eMMC interface, a UFS interface, an eUFS interface, and/or a CF card interface.

The storage server 2200 may further include a switch 2230 and the NIC 2240. The switch 2230 may selectively connect the processor 2210 to the storage device 2250 or selectively connect the NIC 2240 to the storage device 2250 via the control of the processor 2210.

In an embodiment, the NIC 2240 may include a network interface card and a network adaptor. The NIC 2240 may be connected to the network 2300 by a wired interface, a wireless interface, a Bluetooth interface, or an optical interface. The NIC 2240 may include an internal memory, a digital signal processor (DSP), and a host bus interface and be connected to the processor 2210 and/or the switch 2230 through the host bus interface. The host bus interface may be implemented as one of the above-described examples of the interface 2254. In an embodiment, the NIC 2240 may be integrated with at least one of the processors 2210, the switch 2230, and the storage device 2250.

In the storage servers 2200 to 2200m or the application servers 2100 to 2100n, a processor may transmit a command to storage devices 2150 to 2150n and 2250 to 2250m or the memories 2120 to 2120n and 2220 to 2220m and program or read data. In this case, the data may be data of which an error is corrected by an ECC engine. The data may be data on which a data bus inversion (DBI) operation or a data masking (DM) operation is performed, and may include cyclic redundancy code (CRC) information. The data may be data encrypted for security or privacy.

Storage devices 2150 to 2150n and 2250 to 2250m may transmit a control signal and a command/address signal to NAND flash memory devices 2252 to 2252m in response to a read command received from the processor. Thus, when data is read from the NAND flash memory devices 2252 to 2252m, a read enable (RE) signal may be input as a data output control signal, and thus, the data may be output to a DQ bus. A data strobe signal DQS may be generated using the RE signal. The command and the address signal may be latched in a page buffer based on a rising edge or falling edge of a write enable (WE) signal.

The controller 2251 may control all operations of the storage device 2250. In an embodiment, the controller 2251 may include SRAM. The controller 2251 may write data to the NAND flash memory device 2252 in response to a write command or read data from the NAND flash memory device 2252 in response to a read command. For example, the write command and/or the read command may be provided from the processor 2210 of the storage server 2200, the processor 2210m of another storage server 2200m, or the processors 2110 and 2110n of the application servers 2100 and 2100n. DRAM 2253 may temporarily store (or buffer) data to be written to the NAND flash memory device 2252 or data read from the NAND flash memory device 2252. Also, the DRAM 2253 may store metadata. Here, the metadata may be user data or data generated by the controller 2251 to manage the NAND flash memory device 2252. The storage device 2250 may include a secure element (SE) for security or privacy.

Some or all of the memories 2120 to 2120n and 2220 to 2220m and the DRAM 2253 may include the memory device 100 according to embodiments of the present disclosure. Accordingly, each of the memories 2120 to 2120n and 2220 to 2220m and the DRAM 2253 may include the memory device 100 of FIG. 1 and the sense amplifier of FIG. 10 included in the memory device 100 and may operate based on the method of operating the sense amplifier 240, which is described with reference to FIG. 17.

A memory device including a sense amplifier according to embodiments of the present disclosure may decrease a difference between the amount of charges stored at the sensing bit line SBL and the amount of charges stored at the complementary sensing bit line SBLB through a bilateral symmetric structure when performing a sensing operation. Also, when the sense amplifier senses a voltage difference of the bit line BL and the complementary bit line BLB, the sense amplifier may charge the sensing bit line SBL and the complementary sensing bit line SBLB to a desired voltage level. Accordingly, the sensing performance of the sense amplifier may be improved.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A sense amplifier comprising:

a sense amplifier circuit including a first NMOS transistor and a second NMOS transistor, wherein the first NMOS transistor is connected to a first bit line connected to a first memory cell among a plurality of memory cells included in a volatile memory device and the second NMOS transistor is connected to a second bit line complementary to the first bit line;

a first isolation/offset cancellation circuit including a first isolation switch configured to connect the first bit line and a first sensing bit line in response to an isolation signal and a first offset cancellation switch configured to connect the first bit line and a second sensing bit line complementary to the first sensing bit line in response to an offset cancellation signal; and a second isolation/offset cancellation circuit including a second isolation switch configured to connect the second bit line and the second sensing bit line in response to the isolation signal and a second offset cancellation switch configured to connect the second bit line and the first sensing bit line in response to the offset cancellation signal, wherein the sense amplifier circuit further includes:

a first equalization switch configured to connect the second sensing bit line with a first power node in response to an equalization signal;

a precharge switch configured to selectively couple the first power node to a first driving voltage and an activation switch configured to selectively couple the first power node to a second driving voltage, wherein the first and second driving voltages are both positive and have different levels relative to each other; and a second equalization switch configured to connect the first sensing bit line with the first power node in response to the equalization signal.

2. The sense amplifier of claim 1, wherein, during a precharge operation, the first and second isolation switches are configured to be turned on responsive to the isolation signal, the first and second offset cancellation switches are configured to be turned on responsive to the offset cancellation signal, and the first bit line and the second bit line are configured to be charged with the first driving voltage.

3. The sense amplifier of claim 2, wherein, before the precharge operation, the first and second equalization switches are configured to be turned on responsive to the equalization signal, such that the first sensing bit line and the second sensing bit line are charged with the first driving voltage.

4. The sense amplifier of claim 1, wherein, during a charge sharing operation, the first and second isolation switches are configured to be turned off responsive to the isolation signal, the first and second offset cancellation switches are configured to be turned off responsive to the offset cancellation signal, and the first bit line is configured to be charged or discharged based on charge sharing between charges of the first bit line and charges of the first memory cell connected to the first bit line.

5. The sense amplifier of claim 4, wherein the sense amplifier circuit further includes:

a first PMOS transistor configured to connect the second sensing bit line and a second power node in response to a first voltage of the first sensing bit line; and a second PMOS transistor configured to connect the first sensing bit line and the second power node in response to a second voltage of the second sensing bit line, and wherein, during the charge sharing operation, when the first and second equalization switches are turned off responsive to the equalization signal and the first and second PMOS transistors are turned on in response to the first and second voltages of the first and second sensing bit lines, respectively, the first sensing bit line and the second sensing bit line are configured to be charged or discharged based on a voltage level applied to the second power node.

6. The sense amplifier of claim 5, wherein, during a pre-sensing operation, when the first and second isolation switches are turned off responsive to the isolation signal and the first and second offset cancellation switches are turned off responsive to the offset cancellation signal, the first sensing bit line and the second sensing bit line are configured to be charged or discharged to an input voltage or a ground voltage based on a voltage change of the first bit line, and wherein the input voltage is applied to the second power node and the ground voltage is applied to a third power node connected to a first terminal of each of the first and second NMOS transistors.

7. The sense amplifier of claim 6, wherein, before the pre-sensing operation, during a precharge operation, the first and second equalization switches are configured to be turned on responsive to the equalization signal, and the first sensing bit line and the second sensing bit line are configured to be charged with the first driving voltage.

8. The sense amplifier of claim 7, wherein a voltage level of the second driving voltage applied through the first power node is independent of a voltage level of the input voltage applied through the second power node.

9. The sense amplifier of claim 1, wherein, during a restore operation, the first and second isolation switches are configured to be turned on responsive to the isolation signal, the first and second offset cancellation switches are configured to be turned off responsive to the offset cancellation signal, and the first memory cell is configured to store data based on a voltage level of the first sensing bit line.

10. A method of operating a sense amplifier, the method comprising:

performing a first precharge operation, such that a first bit line and a second bit line are precharged with a first driving voltage of a plurality of driving voltages of a memory device, wherein the first bit line is connected to a first memory cell among a plurality of memory cells included in a volatile memory device and the second bit line is complementary to the first bit line and is connected to a second memory cell among the plurality of memory cells;

after performing the first precharge operation, performing a charge sharing operation, such that charges of the first memory cell and charges of the first bit line are shared;

after performing the charge sharing operation, performing a second precharge operation, such that a first sensing bit line and a second sensing bit line complementary to the first sensing bit line are maintained at a same driving voltage throughout a time interval, the same driving voltage corresponding to a second driving voltage of the plurality of driving voltages;

after performing the second precharge operation, performing a pre-sensing operation, such that the first sensing bit line is charged or discharged based on a voltage change of the first bit line; and after performing the pre-sensing operation, performing a restore operation, such that the first bit line is charged or discharged based on a voltage change of the first sensing bit line.

11. The method of claim 10, wherein the performing of the charge sharing operation includes:

when data stored in the first memory cell have a first logical value, charging the first bit line; and when the data stored in the first memory cell have a second logical value, discharging the first bit line.

12. The method of claim 10, further comprising:

before performing the first precharge operation, charging the first sensing bit line and the second sensing bit line with the first driving voltage.

13. The method of claim 12, wherein the sense amplifier includes:

a first equalization switch configured to connect the second sensing bit line with a first power node, to which the first driving voltage or the second driving voltage is applied, in response to an equalization signal; and a second equalization switch configured to connect the first sensing bit line with the first power node in response to the equalization signal, and wherein the method further comprises:

when the first and second equalization switches are turned on responsive to the equalization signal, charging the first sensing bit line and the second sensing bit line with the first driving voltage or the second driving voltage.

14. The method of claim 13, wherein the sense amplifier performs the pre-sensing operation after the first and second equalization switches are turned off responsive to the equalization signal.

15. The method of claim 10, wherein the sense amplifier includes:

a first PMOS transistor configured to connect the second sensing bit line and a second power node in response to a first voltage of the first sensing bit line; and a second PMOS transistor configured to connect the first sensing bit line and the second power node in response to a second voltage of the second sensing bit line, and wherein the method further comprises:

during the pre-sensing operation, charging the first sensing bit line or the second sensing bit line with an input voltage applied to the second power node, based on a voltage change of the first bit line caused by the charge sharing operation.

16. The method of claim 15, wherein a voltage level of the second driving voltage is independent of a voltage level of the input voltage applied through the second power node.

17. A memory device comprising:

memory cells including a first memory cell and a second memory cell;

a first bit line connected to the first memory cell;

a second bit line being complementary to the first bit line and connected to the second memory cell; and a sense amplifier configured to sense data stored in the first memory cell based on a voltage change of the first bit line, wherein the sense amplifier includes:

a sense amplifier circuit including a first NMOS transistor connected to the first bit line, a second NMOS transistor connected to the second bit line, a first equalization switch configured to connect a second sensing bit line with a first power node, to which a first driving voltage or a second driving voltage of the memory device is applied, in response to an equalization signal, and a second equalization switch configured to connect a first sensing bit line with the first power node in response to the equalization signal;

a first isolation/offset cancellation circuit including a first isolation switch configured to connect the first bit line and the first sensing bit line in response to an isolation signal and a first offset cancellation switch configured to connect the first bit line and the second sensing bit line complementary to the first sensing bit line in response to an offset cancellation signal;

a second isolation/offset cancellation circuit including a second isolation switch configured to connect the second bit line and the second sensing bit line in response to the isolation signal and a second offset cancellation switch configured to connect the second bit line and the first sensing bit line in response to the offset cancellation signal; and a conjunction circuit including a precharge switch configured to connect the first power node with a second power node, to which the first driving voltage is applied, in response to a precharge signal applied to the precharge switch and an activation switch configured to connect the first power node with a third power node, to which the second driving voltage is applied, in response to an activation signal applied to the activation switch.

18. The memory device of claim 17, wherein, during a precharge operation, the first and second isolation switches are turned on responsive to the isolation signal and the first and second offset cancellation switches are turned on responsive to the offset cancellation signal, the first bit line and the second bit line are configured to be charged with the first driving voltage, and wherein, before the precharge operation, the first and second equalization switches are turned on responsive to the equalization signal and the precharge switch is turned on responsive to the precharge signal, the first sensing bit line and the second sensing bit line are configured to be charged with the first driving voltage.

19. The memory device of claim 17, wherein the sense amplifier circuit further includes:

a first PMOS transistor configured to connect the second sensing bit line and a fourth power node in response to a first voltage of the first sensing bit line; and a second PMOS transistor configured to connect the first sensing bit line and the fourth power node in response to a second voltage of the second sensing bit line, and wherein, during a pre-sensing operation, when the first and second isolation switches are configured to be turned off responsive to the isolation signal and the first and second offset cancellation switches are configured to be turned off responsive to the offset cancellation signal, the first sensing bit line and the second sensing bit line are charged or discharged to an input voltage or a ground voltage based on a voltage change of the first bit line, and wherein the input voltage is applied to the fourth power node and the ground voltage is applied to a fifth power node connected to a first terminal of each of the first and second NMOS transistors.

20. The memory device of claim 19, wherein, before the pre-sensing operation, during a precharge operation, the first and second equalization switches are configured to be turned on responsive to the equalization signal and the activation switch is configured to be turned on responsive to the activation signal, the first sensing bit line and the second sensing bit line are configured to be charged with the second driving voltage.

\* \* \* \* \*